(12) United States Patent
Rhie

(10) Patent No.: US 9,030,879 B2
(45) Date of Patent: May 12, 2015

(54) METHOD AND SYSTEM FOR PROGRAMMING NON-VOLATILE MEMORY WITH JUNCTIONLESS CELLS

(71) Applicant: Conversant Intellectual Property Management Incorporated, Ottawa (CA)

(72) Inventor: Hyoung Seub Rhie, Ottawa (CA)

(73) Assignee: Conversant Intellectual Property Management Incorporated, Ottawa, Ontario (CA)

(*) Notice: Subject to any disclaimer, the term of this patent is extended or adjusted under 35 U.S.C. 154(b) by 130 days.

(21) Appl. No.: 13/832,785

(22) Filed: Mar. 15, 2013

(65) Prior Publication Data

US 2014/0133238 A1 May 15, 2014

Related U.S. Application Data

(60) Provisional application No. 61/726,775, filed on Nov. 15, 2012.

(51) Int. Cl.
*G11C 11/34* (2006.01)
*G11C 16/10* (2006.01)
*G11C 16/04* (2006.01)

(52) U.S. Cl.
CPC ............ *G11C 16/10* (2013.01); *G11C 16/0483* (2013.01)

(58) Field of Classification Search
USPC ............. 365/185.01, 185.02, 185.03, 185.05, 365/185.06, 185.17, 185.18, 185.23
See application file for complete search history.

(56) References Cited

U.S. PATENT DOCUMENTS

| | | | |
|---|---|---|---|
| 5,473,563 A | 12/1995 | Suh et al. | |
| 6,560,162 B2 | 5/2003 | Kwon | |
| 7,161,837 B2 | 1/2007 | Park | |
| 7,440,326 B2 | 10/2008 | Ito | |
| 7,525,841 B2 | 4/2009 | Aritome | |
| 7,551,492 B2 | 6/2009 | Kim | |
| 7,813,169 B2 | 10/2010 | Kux et al. | |
| 7,813,184 B2 | 10/2010 | Kim et al. | |
| 7,852,676 B2 | 12/2010 | Maejima | |

(Continued)

FOREIGN PATENT DOCUMENTS

WO 2011137257 11/2011

OTHER PUBLICATIONS

Suh, K. et al, A 3.3 V 32 Mb NAND Flash Memory With Incremental Step Pulse Programming Scheme, IEEE Journal of Solid-State Circuits, vol. 30, No. 11, Nov. 1995, pp. 1149-1156.

(Continued)

*Primary Examiner* — Fernando Hidalgo
(74) *Attorney, Agent, or Firm* — Winstead PC

(57) ABSTRACT

A non-volatile memory system that has junctionless transistors is provided that uses suppression of the formation of an inversion-layer source and drain in the junctionless transistors to cause a discontinuous channel in at least one string. The system may include NAND flash memory cells composed of junctionless transistors, and has a set of wordlines. During program operation, a selected wordline of the set of wordlines is biased at a program voltage, and wordline voltage low enough to suppress the formation of source/drains is applied on at least one word line on a source side of the selected wordline such that a channel isolation occurs thereby causing the discontinuous channel in the at least string.

25 Claims, 21 Drawing Sheets

(56) References Cited

U.S. PATENT DOCUMENTS

| | | | |
|---|---|---|---|
| 7,885,115 B2 | 2/2011 | Lee et al. | |
| 7,940,578 B2 | 5/2011 | Kang et al. | |
| 7,944,752 B2 | 5/2011 | Lee | |
| 7,952,943 B2 | 5/2011 | Cho | |
| 7,978,518 B2 | 7/2011 | Pyeon et al. | |
| 7,994,011 B2 | 8/2011 | Park et al. | |
| 8,045,386 B2 | 10/2011 | Santin et al. | |
| 8,085,616 B2 | 12/2011 | Ryu | |
| 8,189,390 B2 | 5/2012 | Kim | |
| 8,189,391 B2 | 5/2012 | Itagaki et al. | |
| 8,199,573 B2 | 6/2012 | Fukuzumi et al. | |
| 8,203,211 B2 | 6/2012 | Jeong | |
| 8,203,882 B2 | 6/2012 | Hishida et al. | |
| 8,259,503 B2 | 9/2012 | Park et al. | |
| 8,264,031 B2 | 9/2012 | Kidoh et al. | |
| 8,278,170 B2 | 10/2012 | Lee et al. | |
| 8,278,695 B2 | 10/2012 | Kidoh et al. | |
| 2006/0083062 A1 | 4/2006 | Park | |
| 2010/0078701 A1 | 4/2010 | Shim et al. | |
| 2010/0195395 A1* | 8/2010 | Jeong et al. | 365/185.17 |
| 2011/0019486 A1 | 1/2011 | Jang et al. | |
| 2011/0170352 A1 | 7/2011 | Kim | |
| 2011/0280066 A1* | 11/2011 | Park et al. | 365/184 |
| 2011/0286276 A1* | 11/2011 | Lin et al. | 365/185.18 |
| 2011/0310666 A1* | 12/2011 | Miida et al. | 365/185.11 |
| 2012/0181699 A1 | 7/2012 | Chen et al. | |
| 2012/0182802 A1 | 7/2012 | Hung et al. | |
| 2012/0182806 A1 | 7/2012 | Chen et al. | |

OTHER PUBLICATIONS

Tanaka, et al., "Bit Cost Scalable Technology with Punch and Plug Process for Ultra High Density Flash Memory", Center for Semiconductor Research and Development and Process and Manufacturing Engineering Center, TOSHIBA Corporation, Semiconductor Company, 2007 Symposium on VLSI Technology Digest of Technical Papers, Jun. 2007, pp. 14-15.

Jang, et al., "Vertical Cell Array using TCAT (Terabit Cell Array Transistor) Technology for Ultra High Density NAND Flash Memory" Advanced Technology Development Team 2 and Process Development Team, Memory R and D Center, Memory Division, Samsung Electronics Co. Ltd., 2009 Symposium on VLSI Technology Digest of Technical Papers, Jun. 2009, pp. 192-193.

Yoohyun Noh et al, "A New Metal Control Gate Last Process (MCGL Process) for High Performance DC-SF (Dual Control Gate With Surrounding Floating Gate) 3D NAND Flash Memory", 2012 Symposium on VLSI Technology Digest of Technical Papers; Jun. 2012, pp. 1-2.

Fukuzumi, et al., "Optimal Integration and Characteristics of Vertical Array Devices for Ultra-High Density, Bit-Cost Scalable Flash Memory", Center for Semiconductor Research and Development, TOSHIBA Corporation, Semiconductor Company, Toshiba Information Systems (Japan) Corporation, Dec. 2007, pp. 449-452.

Akihiro Nitayama et al, "Bit Cost Scalable (BiCS) Flash Technology for Future Ultra High Density Storage Devices", VLSI Technology Systems and Applications (VLSI TSA), 2010 International Symposium, Apr. 2010, pp. 130-131.

Megumi Ishiduki et al, "Optimal Device Structure for Pipe-shaped BiCS Flash Memory for Ultra High Density Storage Device with Excellent Performance and Reliability", Electron Devices Meeting (IEDM), 2009 IEEE International, Dec. 2009, pp. 27.3.1-27.3.4.

Ryota Katsumata et al, "Pipe-shaped BiCS Flash Memory with 16 Stacked Layers and Multi-Level-Cell Operation for Ultra High Density Storage Devices", VLSI Technology Symposium, Jun. 2009, pp. 136-137.

Ki-Tae Park et al, "A 45nm 4Gb 3-Dimensional Double-Stacked Multi-Level NAND Flash Memory with Shared Bitline Structure", Solid-State Circuits Conference, ISSCC 2008 Digest of Technical Papers,, pp. 510-511 and 632, Feb. 6, 2008.

Jin-Ki Kim et al, "A 120mm2 64Mb NAND Flash Memory Achieving 180nslByte Effective Program Speed", 1996 Symposium on VLSI Circuits DIgest of Technical Papers, Jun. 1996, pp. 168-169.

Lee, June et al, High-Performance 1-Gb NAND Flash Memory With .012-um Technology, IEEE Journal of Solid-State Circuits, vol. 37, No. 11, Nov. 2002, pp. 1502-1509.

Ki-Tae Park et al, "A Novel NAND Flash Memory With Asymmetric S/D Structure Using Fringe-Field-Induced Inversion Layer", IEEE Transactions on Electron Devices, vol. 55, Issue 1;, pp. 404-410, Jan. 1, 2008.

Lue, et al., "A Novel Junction-Free BE-SONOS NAND Flash"; Emerging Central Lab, Technology Development Center, Macronix International Co., Ltd.; 2008 Symposium on VLSI Technology Digest of Technical Papers; IEEE; Jan. 2008, pp. 140-141.

Chang-Hyoun Lee et al, "Highly Scalable NAND Flash Memory with Robust Immunity to Program Disturbance Using Symmetric Inversion-Type Source and Drain Structure", 2008 Symposium on VLSI Technology Digest of Technical Papers; Jun. 2008, pp. 118-119.

Lue, et al., "A Highly Scalable 8-Layer 3D Vertical-Gate (VG) TFT NAND Flash Using Junction-Free Buried Channel BE-SONOS Device", Emerging Central Lab, Technology Development Center, Macronix International Co., Ltd., 2010 Symposium on VLSI Technology Digest of Technical Papers, Jun. 2010, pp. 131-132.

Chang, et al., "Memory Architecture of 3D Vertical Gate (3DVG) NAND Flash Using Plural Island-Gate SSL Decoding Method and Study of It's Program Inhibit Characteristics", Macronix International Co., Ltd., Emerging Central Lab, Technology Development Center, Design Center, IEEE, May 2012, pp. 1-4.

Dongyean Oh et al, "A New Self-Boosting Phenomenon by Soure/Drain Depletion Cut-off in NAND Flash Memory", 2007 IEEE Non-Volatile Semiconductor Memory Workshop, Aug. 2007, pp. 1-3.

Il Han Park et al, "Depletion-Enhanced Body-Isolation (DEBI) Array on SOI for Highly Scalable and Reliable NAND Flash Memories", IEEE Transactions on Nanotechnology, vol. 5, No. 3, May 2006, pp. 201-204.

Jung, T. et al, A 117-MM2 3.3-V Only 128-Mb Multilevel NAND Flash Memory for Mass Storage Applications, IEEE Journal of Solid-State Circuits, vol. 31, No. 11, Nov. 1996, pp. 1575-1583.

Hubert, et al., "A Stacked SONOS Technology, up to 4 Levels and 6nm Crystalline Nanowires, with Gate-all-around or Independent Gates (-Flash), Suitable for Full 3D Integration", CEA-LETI, MINATEC, STMicroelectronics, IEEE, Dec. 2009, pp. 1-4.

Chen, et al., "A Highly Pitch Scalable 3D Vertical Gate (VG) NAND Flash Decoded by a Novel Self-Aligned Independently Controlled Double Gate (IDG) String Select Transistor (SSL)", Emerging Central Lab, Technology Development Center, Macronix International Co., Ltd., 2012 Symposium on VLSI Technology Digest of Technical Papers, Jun. 2012, pp. 91-92.

Chen, et al., "A Highly Scalable 8-layer Vertical Gate 3D NAND with Split-page Bit Line Layout and Efficient Binary-sum MiLC (Minimal Incremental Layer Cost) Staircase Contacts", Macronix International Co., Ltd., IEEE, Dec. 2012, pp. 1-4.

Hung, et al., "Design Innovations to Optimize the 3D Stackable Vertical Gate (VG) NAND Flash", Macronix International Co., Ltd., IEEE, Dec. 2012, pp. 1-4.

Hyun-Jin Cho et al, "Modeling of Surrounding Gate MOSFETs With Bulk Trap States", IEEE Transactions on Electron Devices, vol. 54, No. 1, Jan. 2007, pp. 166-169.

Andrew Walker, "Sub-50-nm Dual-Gate Thin-Film Transistors for Monolithic 3-D Flash",IEEE Transactions on Electron Devices, vol. 56, No. 11, Nov. 2009, pp. 2703-2710.

Meikei Ieong et al, "DC and AC Performance Analysis of 25 nm Symmetric/Asymmetric Double-Gate, Back-Gate and Bulk CMOS", 2000 Simulation of Semiconductor Processes and Devices, Sep. 2000, pp. 147-150.

Hiroshi Nakamura et al, "A Novel Sense Amplifier for Flexible Voltage Operation NAND Flash Memories", 1995 Symposium on VLSI Circuits Digest of Technical Papers, Jun. 1995, pp. 71-72.

L. Cippa et al, "Nonvolatile Memories: NOR vs. NAND Architectures", Memories in Wireless Systems, Aug. 2008, pp. 29-53.

Yosuke Komori et al, "Disturbless Flash Memory due to High Boost Efficiency on BiCS Structure and Optimal Memory Film Stack for Ultra High Density Storage Device", 2008 Electron Devices Meeting, Dec. 2008, pp. 1-4.

* cited by examiner

| Page $2^m$-1 |
| Page $2^m$-2 |
| Page $2^m$-3 |
| ⋮ |
| Page 3 |
| Page 2 |
| Page 1 |
| Page 0 |

FIG. 3

METHOD AND SYSTEM FOR PROGRAMMING NON-VOLATILE MEMORY WITH JUNCTIONLESS CELLS

CROSS REFERENCE TO RELATED APPLICATION

This application claims the benefit of priority from U.S. Provisional Patent Application No. 61/726,775 filed Nov. 15, 2012 the disclosure of which is expressly incorporated herein by reference in its entirety.

FIELD

The present disclosure relates generally to a semiconductor device. More particularly, the present disclosure relates to a nonvolatile memory.

BACKGROUND

Flash memory is a commonly used type of non-volatile memory in widespread use as storage for consumer electronics and mass storage applications. Flash memory is pervasive in popular consumer products such as digital audio/video players, cell phones and digital cameras, for storing application data and/or media data. Flash memory can further be used as a dedicated storage device, such as a portable flash drive pluggable into a universal serial port (USB) of a personal computer, and a magnetic hard disk drive (HDD) replacement for example. It is well known that flash memory is non-volatile, meaning that it retains stored data in the absence of power, which provides a power savings advantage for the above mentioned consumer products. Flash memory is suited for such applications due to its relatively high density for a given area of its memory array.

SUMMARY

In one aspect of the present disclosure, there is provided a nonvolatile memory comprising a cell structure with cell transistors, whereby these cell transistors contain fringe field induced (virtual) source and drains.

In another aspect of the present disclosure, there is provided a method for this kind of nonvolatile memory to inhibit inadvertent programming or disturbances of unselected cells in unselected strings connected to selected word lines during program operation.

In another aspect of the present disclosure, there is provided a method for this kind of nonvolatile memory to inhibit inadvertent programming or disturbances of unselected cells connected to unselected word lines during program operation. For example, it provides a method for protecting data of unselected cells connected to unselected word lines which have already been programmed in prior programming operations.

According to one aspect of the present disclosure, there is provided a non-volatile memory system comprising junctionless transistors that uses suppression of the formation of an inversion-layer source and drain in at least one of the junctionless transistors to cause a discontinuous channel in at least one string.

According to another aspect of the present disclosure, there is provided a method for use in a non-volatile memory system comprising junctionless transistors, the method comprising: during program operation, suppressing the formation of an inversion-layer source and drain in at least one of the junctionless transistors to cause a discontinuous channel in at least one string.

Other aspects and features of the present disclosure will become apparent to those ordinarily skilled in the art upon review of the following description of specific embodiments of the present disclosure in conjunction with the accompanying figures.

BRIEF DESCRIPTION OF THE DRAWINGS

Embodiments of the present disclosure will now be described, by way of example only, with reference to the attached Figures, wherein:

FIG. 3 illustrates a Structure of one NAND Flash block consisting of $2^m$ programmable pages;

DETAILED DESCRIPTION

Generally, the present disclosure relates to a semiconductor device.

More specifically, the present disclosure relates to a non-volatile memory device containing junctionless transistors, such as, for example, a NAND flash memory device. A general description of NAND Flash memory devices will be given in the following sections. For example, it relates to a type of NAND flash memory comprising a cell structure with junctionless cell transistors, whereby these junctionless cell transistors contain fringe-field induced (virtual) source and drains.

Organization of a NAND Flash Memory Cell Array

Figure 1:
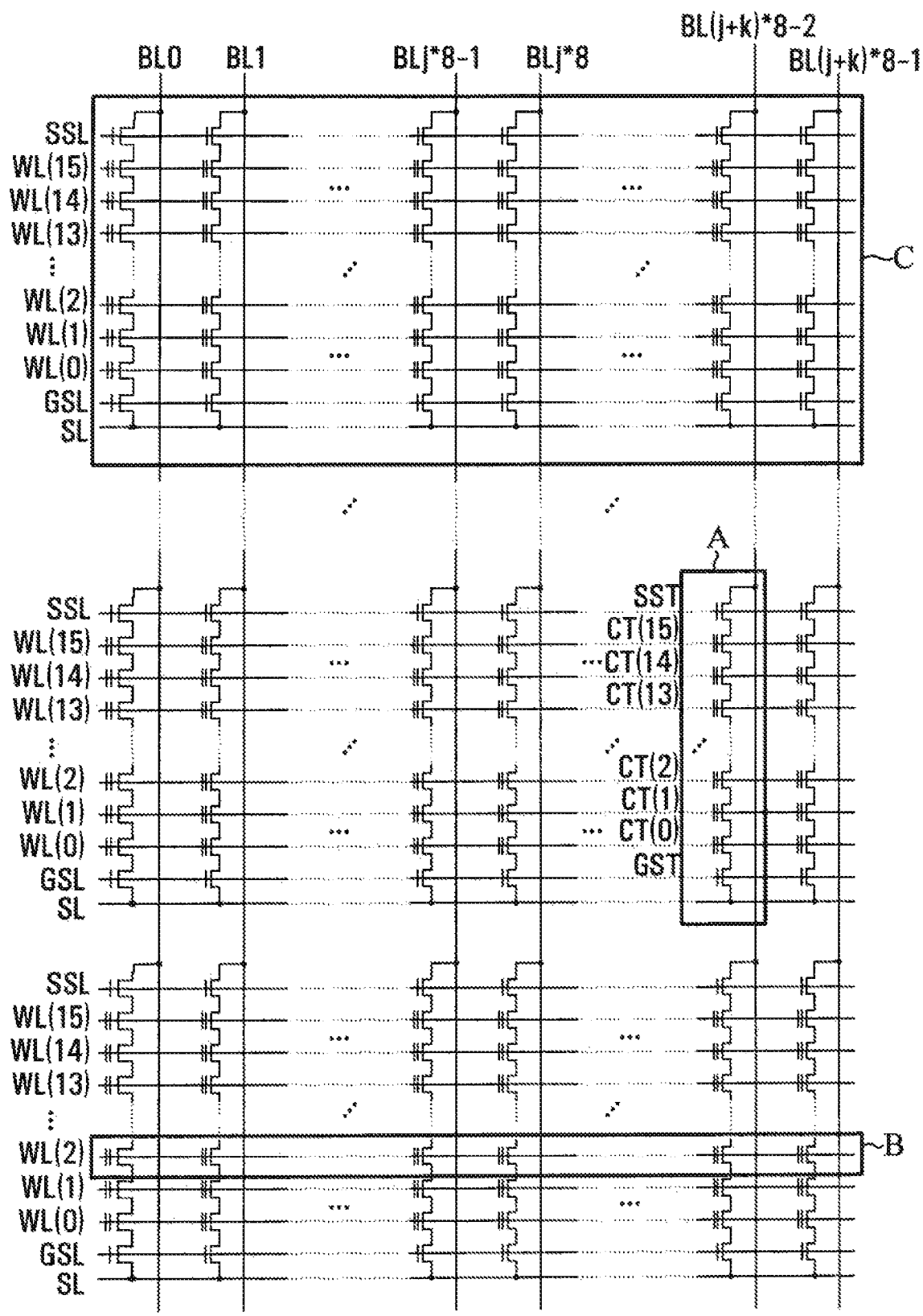
FIG. 1 illustrates String (A), page (B) and block (C) in a NAND Flash cell array.

The basic cell array organization of NAND flash memory devices will be described. FIG. 1 serves as an illustration to describe the terms string, page and block in a NAND Flash memory device.

FIGS. 1 to 21 will be used to describe example details of NAND flash memory. These figures and the associated description apply to both junctionless NAND and non-junctionless NAND unless specifically indicated otherwise. Where n+source/drain regions are shown, the junctionless NAND equivalent would feature fringe-field induced source/drains.

A NAND cell string as illustrated in the box "A" of FIG. 1 consists of at least one string select transistor (SST) which is placed in series with the cell transistors and with one terminal (hereinafter referred to as the drain) being connected to the bit line. A NAND cell string also contains a certain number of memory cell transistors and at least one ground select transistor which is serially connected between the cell transistors and the source line.

Although in this Figure the string consists of 16 cells, the present disclosure is not restricted to any specific number of cells per string. The number of cells per string varies, with 4 cells per string, 8 cells per string, 32 cells per string, 64 cells per string, 128 cells per string or any other number >1 also being possible.

Memory cell gates in FIG. 1 are coupled to word lines (commonly abbreviated WL) 0 to 15. The gate of the string select transistor (SST) is connected to a string select line (SSL) while the drain of the string select transistor (SST) is connected to a bit line (BL). The gate of the ground select transistor (GST) is connected to a ground select line (GSL) while the source of the ground select transistor (GST) is connected to a source line (SL or CSL).

To specify a direction within a string, the direction towards the SSL of a string will be referred to as "drain direction" or "drain side" and the direction towards the GSL of a string will be referred to as "source direction" or "source side" hereinafter.

The box "B" in FIG. 1 illustrates a common example of a page in a NAND Flash device. A page is the smallest unit addressed by a row address. The smallest unit for which a read or program operation can be performed is also one page. In some common examples one page is identical to all cells connected to one word line. However, other examples also exist where cells connected to a certain word line are subdivided into multiple subgroups which thus constitute multiple pages per word line, whereby each one of the multiple pages in one word line has a different row address. In the case of multiple bit storage in one physical cell, different bits can belong to different pages although they are physically located in the same cell transistor and thus connected to the same word line. Hereinafter, the proposed technique will be described using but not be restricted to the example in FIG. 1 where each word line corresponds to one page.

The box "C" in FIG. 1 illustrates the meaning of a cell block. It is constituted by the entirety of strings which share the same word lines, string select lines and ground select lines. In the most common examples of NAND Flash memory devices the smallest unit for which an erase operation can be performed is one cell block, which is therefore often named "erase block".

Figure 2:
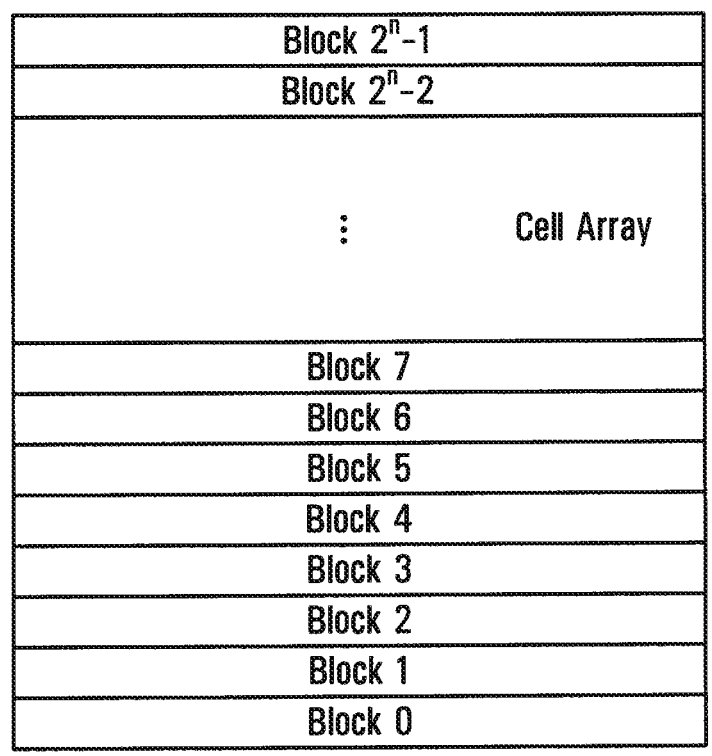
FIG. 2 illustrates a NAND Flash cell array structure.

Assuming that the row address is made of n bits for the block address and m bits for the page address, FIG. 2 illustrates the cell array structure of NAND flash memory. It consists of $2^n$ erase blocks, with each block subdivided into $2^m$ programmable pages as shown in FIG. 3.

Figure 4:
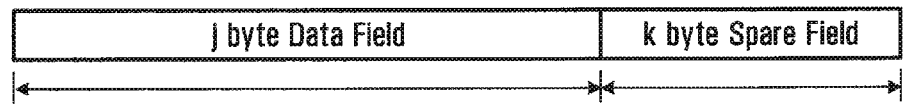
FIG. 4 illustrates a NAND Flash page structure.

Each page consists of (j+k) bytes (times 8 bits) as shown in FIG. 4. The pages are further divided into a j-byte data storage region (data field) with a separate k-byte area (spare field). The k-byte area is typically used for error management functions.

1 page=(j+k)bytes 1 block=$2^m$ pages=(j+k)bytes*$2^m$

Total memory array size=$2^n$ blocks=(j+k)bytes*$2^{m+n}$

Basic Cell Operation of Erase, Program and Read

Figure 5:
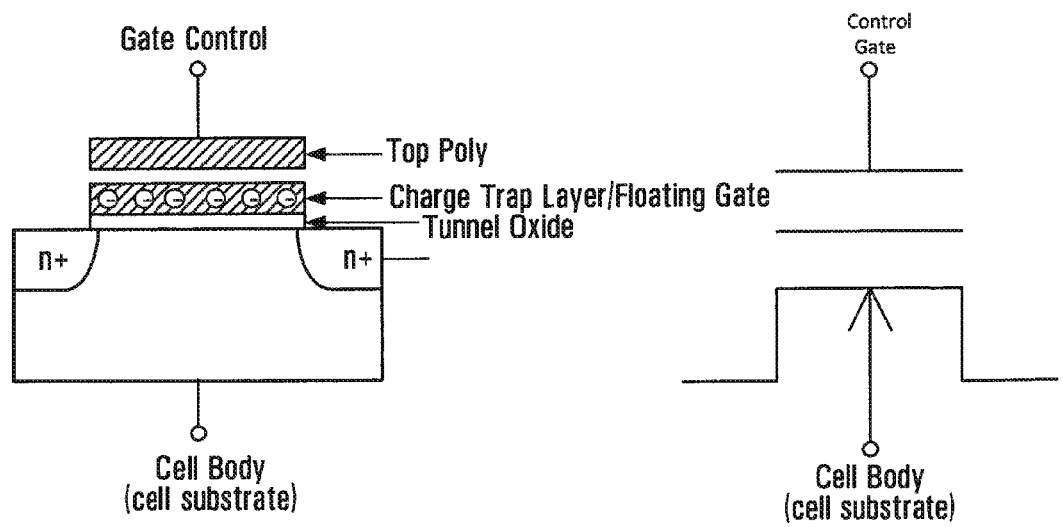
FIG. 5 illustrates a NAND Flash cell transistor.

Erase, program and read operations in a NAND flash memory are described as follows. The structure of a typical NAND Flash cell is illustrated in FIG. 5. NAND flash cell transistors store information by trapping electrons in a floating node either by a technology commonly referred to as "floating gate" or by a technology commonly referred to as "charge trap". The electrons trapped in the floating node of a cell transistor modify the threshold voltage of this cell transistor to different levels depending on the data (0 or 1) stored in the cell. The threshold voltage of the cell transistor influences the cell channel resistance of the cell transistor.

Figure 6:
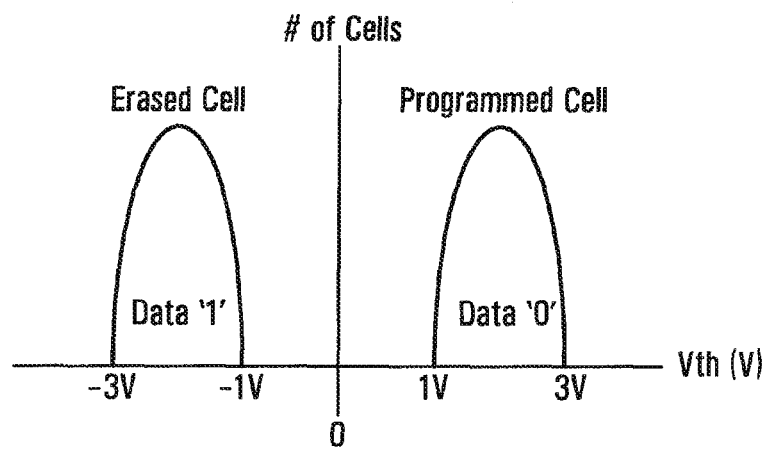
FIG. 6 illustrates a cell threshold voltage distribution for single level cells (1 bit-2 states)
Figure 7:
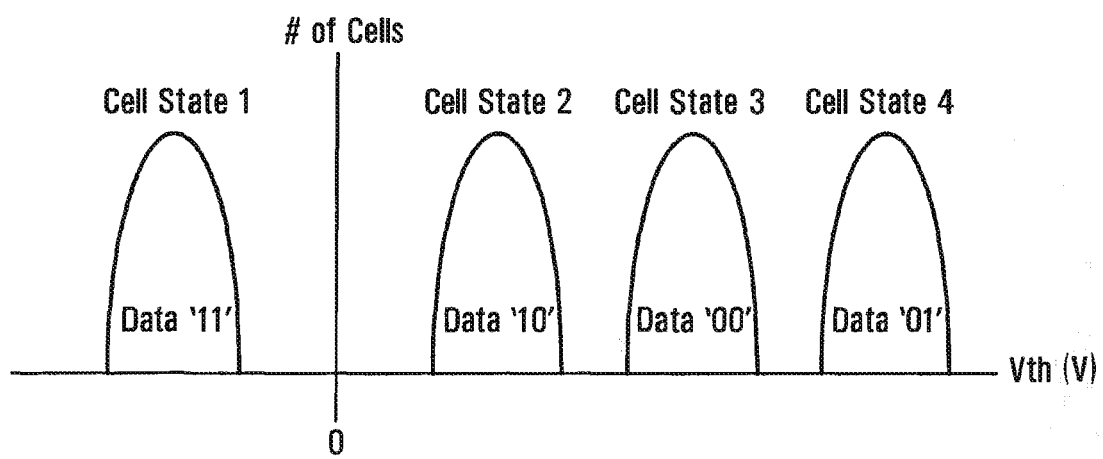
FIG. 7 illustrates a cell threshold voltage distribution for multi-level cells (2 bit-4 states)

In some memory devices, memory cells store two logic states; data '1' and data '0' and each memory cell corresponded to one bit. In this case the flash memory cell can have one of two threshold voltages corresponding to data '1' and data '0'. The cell threshold voltage distribution for these SLC (single level cells) is shown in FIG. 6. In some widely used NAND Flash devices cells can also be programmed to more than two threshold levels and thus multiple bits can be stored in one physical cell (see FIG. 7), which are referred to as MLC (multi-level cells). Even if no explicit reference is made to multiple bit storage, embodiments of the present disclosure will apply equally to NAND memory devices with single and multiple bit storage per cell.

Figure 8:
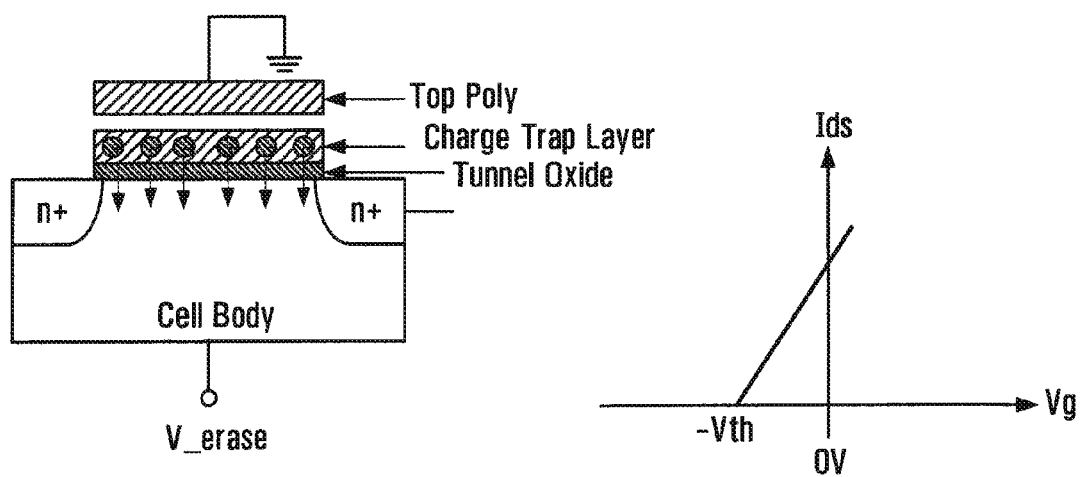
FIG. 8 illustrates an erase operation by Fowler-Nordheim (F-N) Tunneling.

Typically a NAND flash memory cell is erased and programmed by Fowler-Nordheim (F-N) tunneling. During an erase operation, the top gate of the cell is biased to Vss (ground) while the cell body is biased to an erase voltage V_erase and the source and drain of the cell are floated (in the case that the source and the drain consist of N+diffusion layers they are automatically biased to V_erase due to junction-forward-bias from the cell body to the source/drain). With this erase bias condition, trapped electrons (charge) in the floating poly (i.e. floating gate) are emitted uniformly to the substrate through the tunnel oxide as shown in FIG. 8. The cell threshold voltage (Vth) of the erased cell becomes negative as also shown in FIG. 8. In other words, the erased cell transistor is in an on-state with a gate bias Vg of 0V.

During program operation, on the contrary, the top poly (i.e. top gate) of the cell is biased to a program voltage Vpgm while the substrate, source and drain of the cell are biased to Vss (ground). More precisely, the high Vpgm voltage (e.g. 20V) induces a channel under the tunnel oxide, referred to hereinafter as a cell channel to distinguish from a string channel formed between multiple cells; a string channel includes one or more cell channels and source/drain regions between the cell channels. Since this cell channel of the cell biased to the program voltage is electrically connected to the source and drain which are tied to Vss=0V, the cell channel voltage Vch is also tied to ground. By the difference in voltage Vpgm−Vch, electrons from the cell channel are uniformly injected to the floating poly (floating gate) through the tunnel oxide as shown in FIG. 9.

Figure 9:
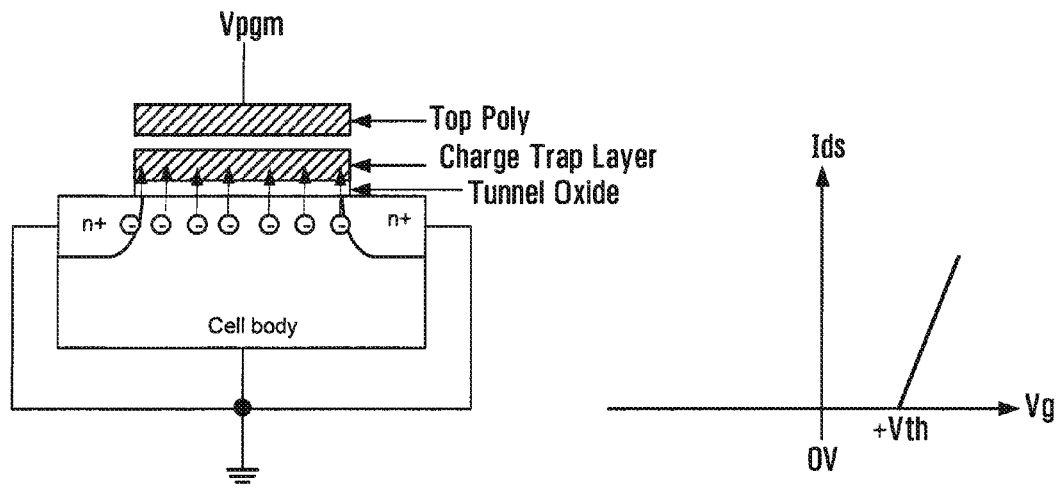
FIG. 9 illustrates a program operation by Fowler-Nordheim (F-N) Tunneling.

The cell threshold voltage Vth of the programmed cell becomes positive as also shown in FIG. 9. In other words, the programmed cell is turned off with a gate bias Vg of 0V).

Figure 10:
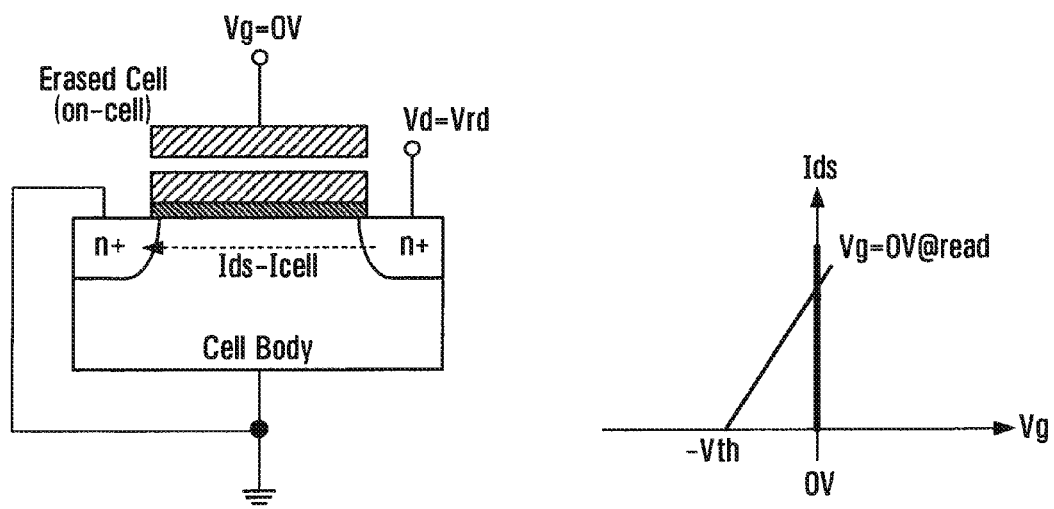
FIG. 10 illustrates a read erased cell (Data '1')
Figure 11:
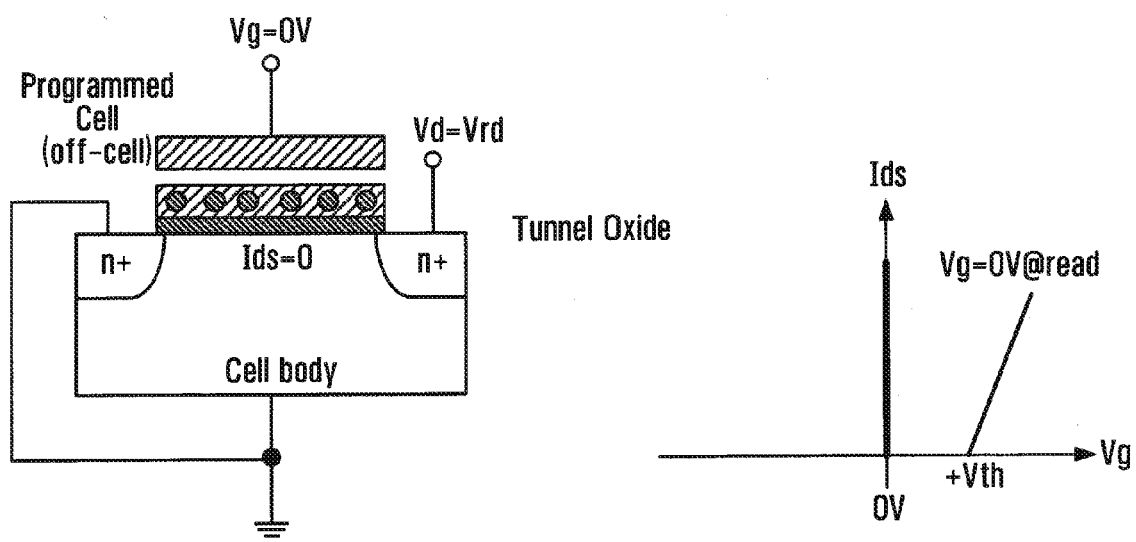
FIG. 11 illustrates a read programmed cell (Data '0')

In order to read cell data, the gate and drain of the selected cells are biased to 0V and a read voltage Vrd, respectively while the source of the selected cells are set to 0V. If the cell is in an erased state as shown in FIG. 10, the erased cell has a negative threshold voltage and thus a cell current (Icell) from the drain to the source flows under the given bias condition. Similarly if the cell is in a programmed state as shown in FIG. 11, the programmed cell has a positive threshold voltage and there is no cell current from the drain to the source under the given bias condition. Finally a sense amplifier connected to each bit line senses and latches cell data; an erased cell (on-cell) is sensed as data '1' and a programmed cell (off-cell) is sensed as data '0'.

Page Read

Figure 12:
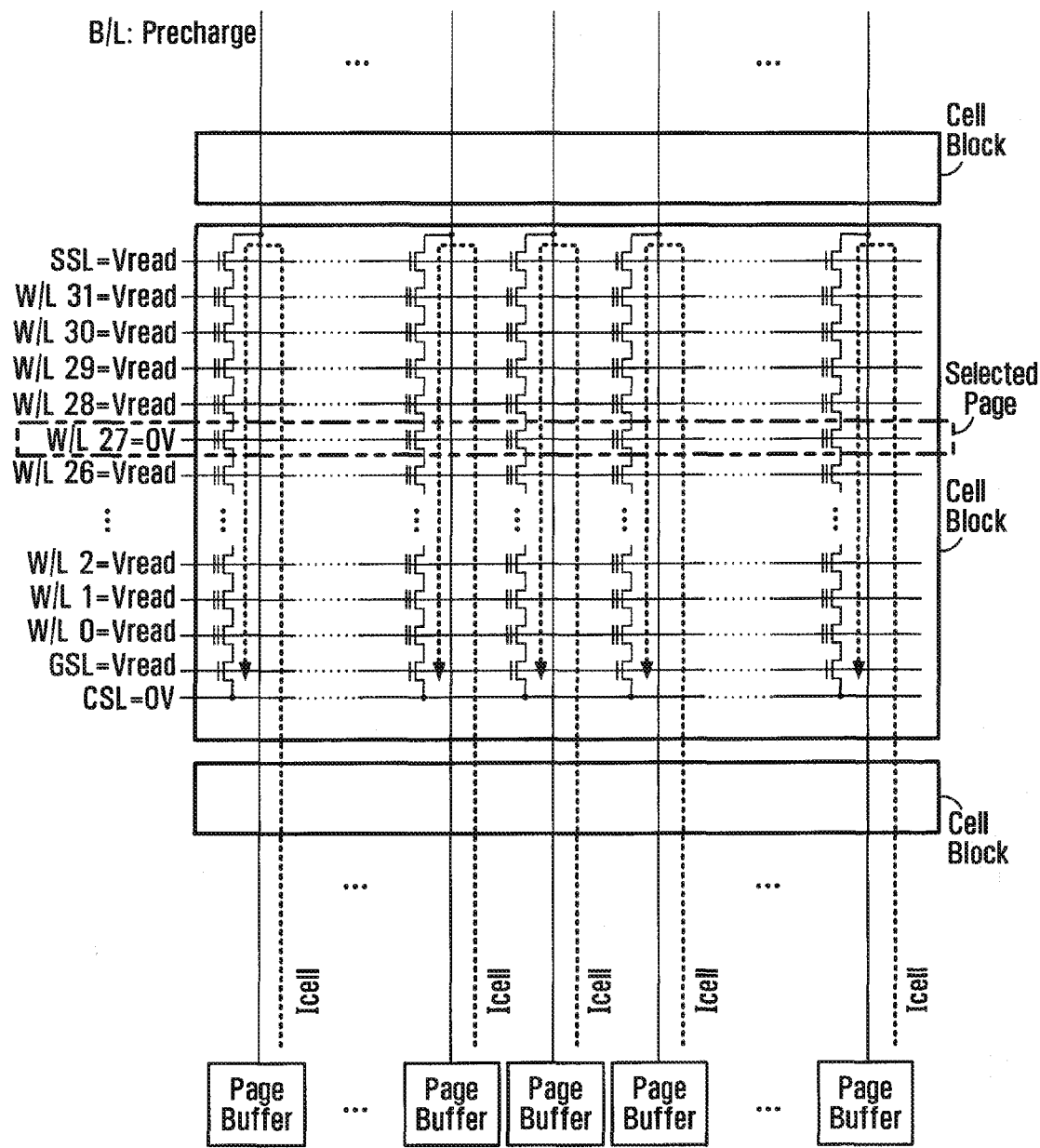
FIG. 12 illustrates page read bias conditions.

FIG. 12 shows bias conditions during page read operations. The selected word line is set to 0V while unselected word lines, SSL, and GSL are biased to a read pass voltage Vread that is sufficiently high to render unselected cell transistors conductive regardless of their programmed state (i.e. cell Vth). The common source line CSL is set to ground. With read bias conditions, the Vth of the selected cell determines cell current Icell. This cell current Icell is sensed by a bit line sense amplifier in a page buffer. An entire page is read in parallel.

Block Erase in NAND Flash

Figure 13:
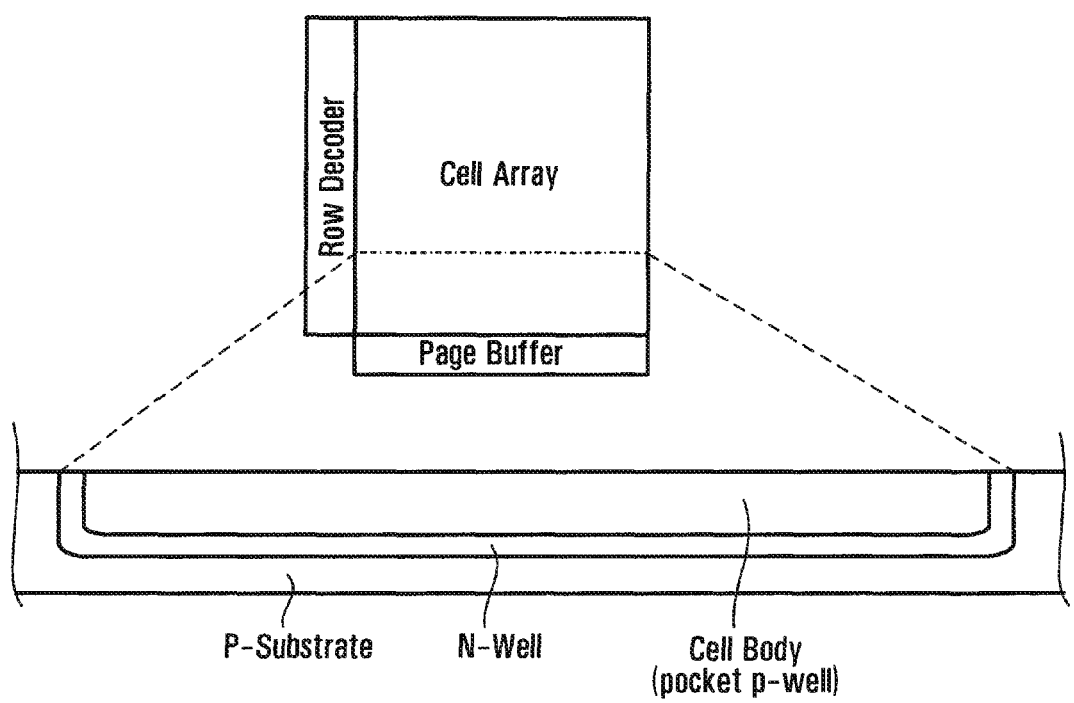
FIG. 13 illustrates a cell substrate structure.

The bias conditions of various nodes in the cell array including the cell body will be described. A detailed description can also be found in, for example, U.S. Pat. No. 5,473,563 in which non-volatile semiconductor memories using arrays of cell units include memory transistor divided into several memory blocks, each having certain number of cell units, with erasable selectable memory blocks. FIG. 13 shows the structure of the cell array substrate for most widely used NAND Flash devices. The cell body is formed by a pocket p-well which is isolated from the p-substrate of chip.

Figure 14:
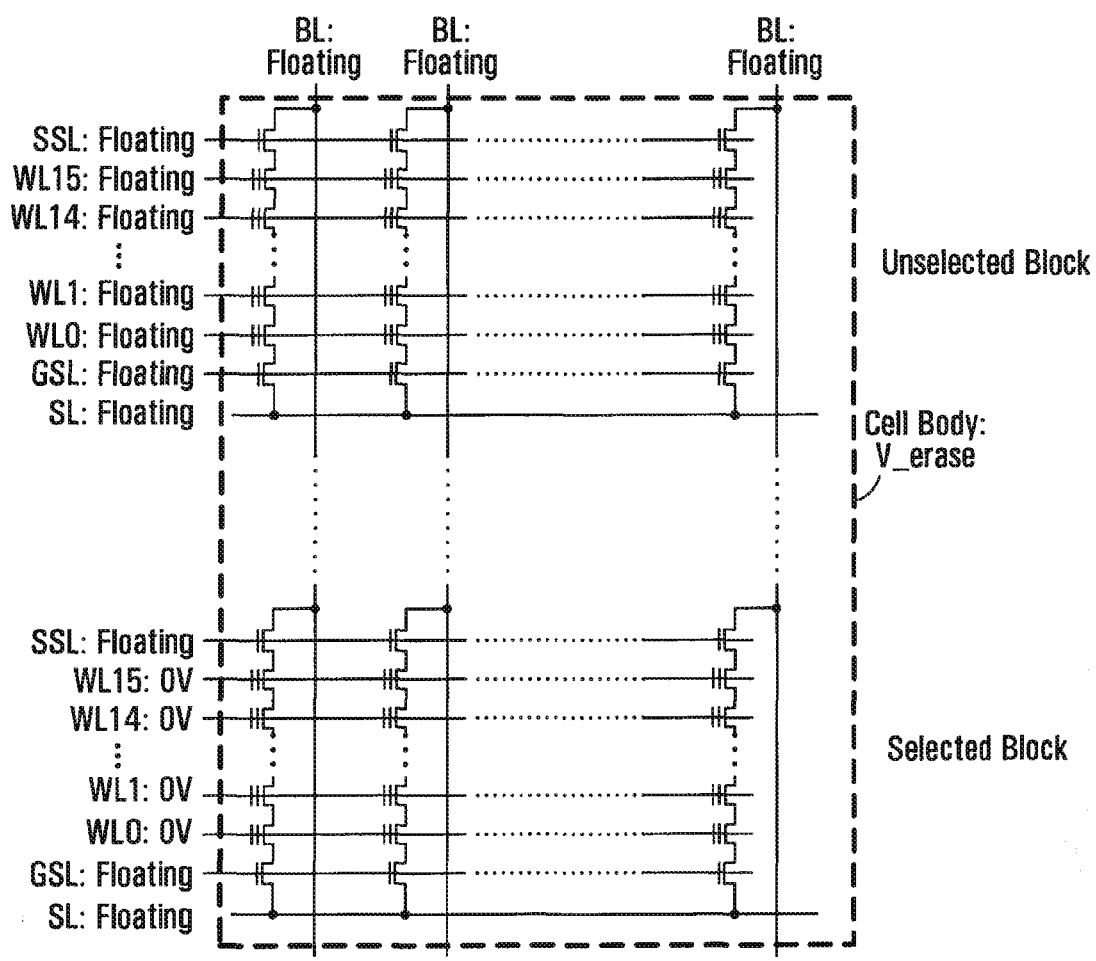
FIG. 14 illustrates a bias condition during erase for a selected and an unselected block.

FIG. 14 and Table 1 show typical bias conditions during erase operations. The cell body is biased to the erase voltage V_erase while the floating bit lines and the source lines (SL) in the selected block are clamped to V_erase-0.6V through the SID diodes of the SSL and GSL transistors. At the same time all word lines in the selected block are biased to 0V while the string select line (SSL) and the ground select line (GSL) are biased to erase voltage V_erase. Therefore all cells within the selected block are erased by F-N tunneling as described in previous section. Because the substrate of the cells is biased to erase voltage V_erase and the source/drain/substrate of cells in the selected block are electrically connected, the erase operation must occur on a block basis. In other words, the minimum erasable array size is a block.

Because of the block basis erase operations, erasure of memory cells in unselected blocks sharing the same cell substrate must be prevented (i.e. erase inhibit). For this purpose the self-boosting erase inhibit scheme has been proposed (e.g., U.S. Pat. No. 5,473,563). To prevent erasure of memory cells in unselected blocks, all word lines in unselected blocks are floated during erase operations. Therefore floated word lines in unselected blocks are boosted to nearly erase voltage V_erase by capacitive coupling between the substrate and word lines (the exact value depending on the coupling ratio–the word line level lies around 90% of V_erase when the substrate of the cell array goes to V_erase). The boosted voltage of word lines in unselected blocks reduces the electric field between the cell substrate and word lines. As a result erasure of memory cells in unselected blocks is prevented.

TABLE 1

| | Bias Conditions during Erase | |
|---|---|---|
| | Selected Block | Unselected Block |
| Bitlines (BL) | Clamped to V_erase-0.6 V | Clamped to V_erase-0.6 V |
| String Select Line (SSL) | Boosted to approx. 90% of V_erase | Boosted to approx. 90% of V_erase |
| Wordlines (WL0~WL15) | 0 V | Boosted to approx. 90% of V_erase |
| Ground Select Line (GSL) | Boosted to approx. 90% of V_erase | Boosted to approx. 90% of V_erase |
| Source Line (SL) | Clamped to V_erase-0.6 V | Clamped to V_erase-0.6 V |
| Cell body | V_erase | V_erase |

Page Program and Program Inhibit

The program operation of a single cell was described in a previous section, where it was described that a high program voltage Vpgm is applied to the control gate, whereas the channel voltage Vch under the tunnel oxide of the cell transistor is tied to the ground level Vss. Cells connected to a wordline that is biased with a program voltage will be referred to as "program cells" or "selected cells" hereinafter.

A string to which a selected cell belongs will be referred to as a "selected string". A selected string is either a program string when the selected cell of the string is to be programmed, or a program inhibit string where the selected cell of the string is to be program inhibited, i.e. the selected cell should not be programmed. Bit lines which are connected to program strings will be referred to as "program bit lines". Bit lines which are connected to program inhibit strings will be referred to as "program inhibit bit lines".

Expanding the program scheme to entire pages and strings which belong to one block, a common method will be described for supplying the needed bias conditions for cell programming during program operation. Furthermore, a method referred to as channel self-boosting program inhibit will be described which ensures that no cells are programmed inadvertently during program operation which are connected to selected word lines and whose control gates are therefore biased with Vpgm but which belong to unselected strings and are not intended to be programmed.

Figure 15:
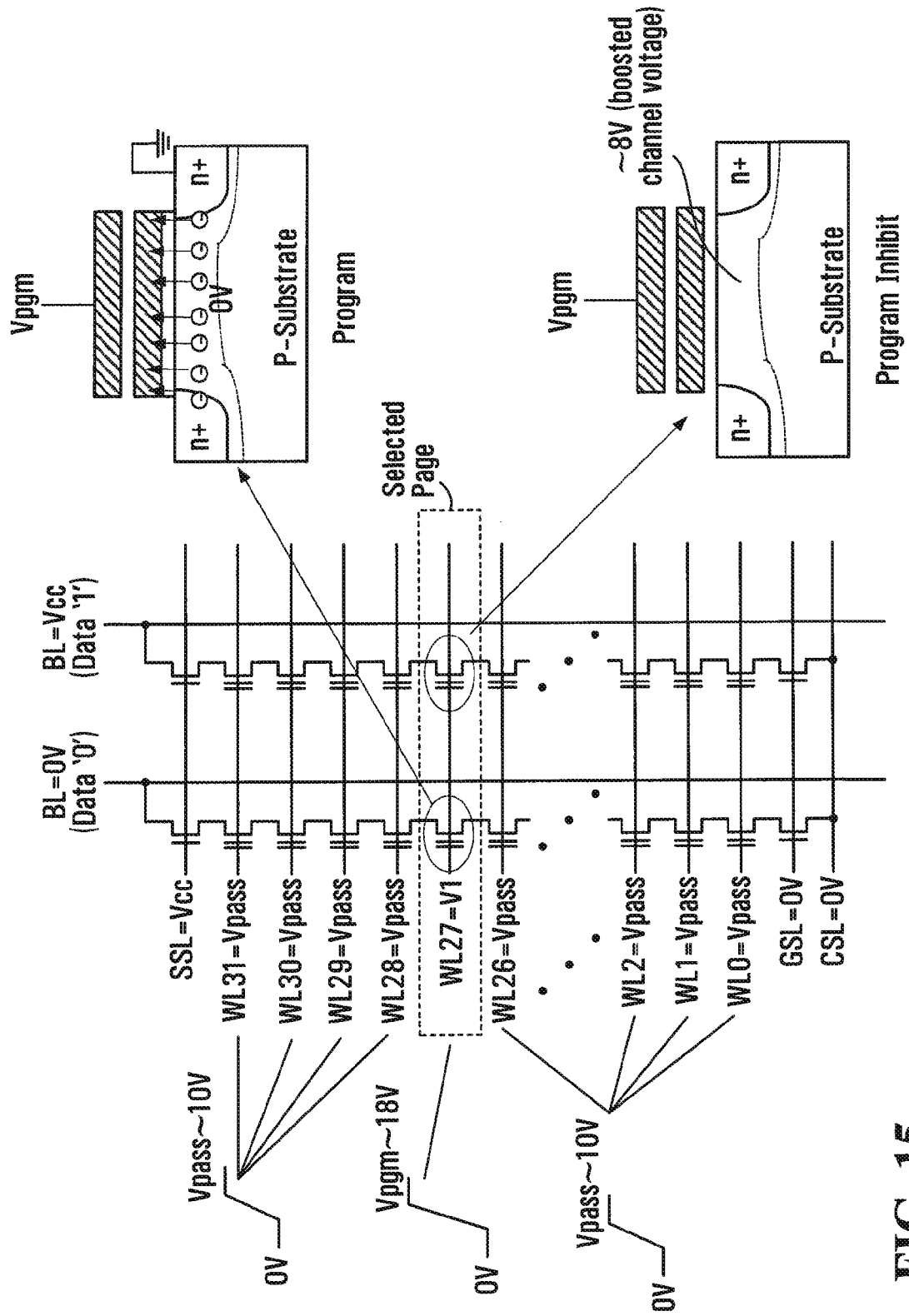
FIG. 15 illustrates page program bias conditions.

FIG. 15 depicts known page program bias conditions (see, Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995). FIG. 15 is used to describe the program and program inhibit operations of NAND Flash devices. Hereby the so-called string channel self-boosting program inhibit scheme which is widely used in some existing systems will be described. The needed bias conditions are applied to selected cells as follows in the most common existing systems.

The program voltage Vpgm is applied to the control gate of a selected cell through the word line to which the selected cell is connected. For brevity this word line will be referred to as "selected word line" hereinafter. The SSL transistor of the selected string is turned on with Vcc applied to the SSL and the GSL transistor turned off. The bit line voltage for a selected cell to be programmed with data "0" is set to Vss=0

V. Thus the ground level Vss is supplied to the channel of the selected cell through the program bit line and the SSL to which this particular string is connected to and through the serially connected cell transistors on the drain side of the selected cell between the selected cell and the SSL. These "drain side" cells are in a turned on state with Vpass applied to their control gates to be able to pass on the string channel voltage Vss. For another reason related to program inhibit described below, source side cells are also turned on with Vpass applied to their control gates in most existing systems. A continuous string channel is formed from the bit line to the selected cell (and beyond) with a string channel voltage Vch of 0V. When the program voltage Vpgm is applied to the gate of a selected cell, the large potential difference between gate and cell channel level Vch results in F-N tunneling of electrons into the floating gate.

For selected cells of program inhibit strings (i.e. cells which should stay in an erased state with data '1') and program inhibit strings generally the connected program inhibit bit line is set to Vcc. For program inhibit, the bit line level of Vcc initially precharges the associated string channel through the turned on SSL transistor, the gate of which is biased also with Vcc as it is connected to the same SSL which also turns on the SSL transistors of program strings. The coupled string channel voltage rises, and once the string channel voltage reaches Vcc−Vth(SSL) the SSL transistor shuts off and the string channel of the program inhibit string becomes a floating node.

Once the word lines of the program inhibit strings rise during program operation (selected word line to the program voltage Vpgm and unselected word lines to the pass voltage Vpass), the series capacitances through the control gate, floating gate, channel, and bulk are coupled and the cell channel potential Vch is boosted automatically beyond the precharge level of Vcc−Vth(SSL). Hereby the word lines on the source side of the selected cell are also raised to Vpass to participate in the channel-boosting. It was shown previously [e.g., Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995] that the floating channel voltage rises to approximately 80% of the gate voltage. Thus the cell channel voltages of selected cells of strings program inhibited are boosted to approximately 8 V in the case that Vpgm~15.5-20 V and Vpass~10 V are applied to the control gates. This high cell channel voltage prevents F-N tunneling in the program inhibited cells.

Figure 16:
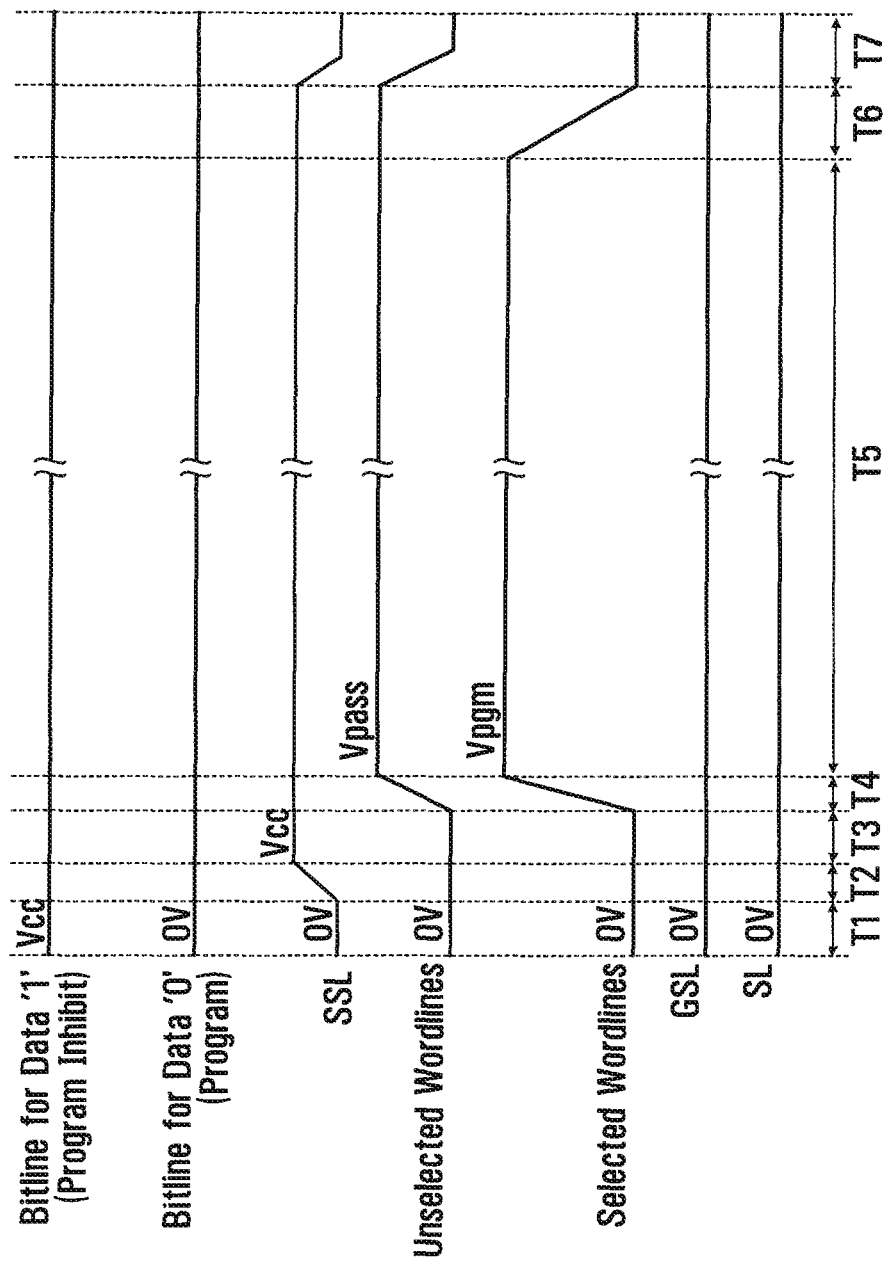
FIG. 16 illustrates a program timing.

FIG. 16 shows an example of timing the voltages during program operation. Numerous variations of this program timing scheme exist including the application of multiple pulses for Vpgm and Vpass. Although the embodiments of the present disclosure will be described using the program timing given in FIG. 16 they are not restricted to any program timing scheme in particular.

Program Disturbance and Pass Disturbance (Stress)

Figure 18:
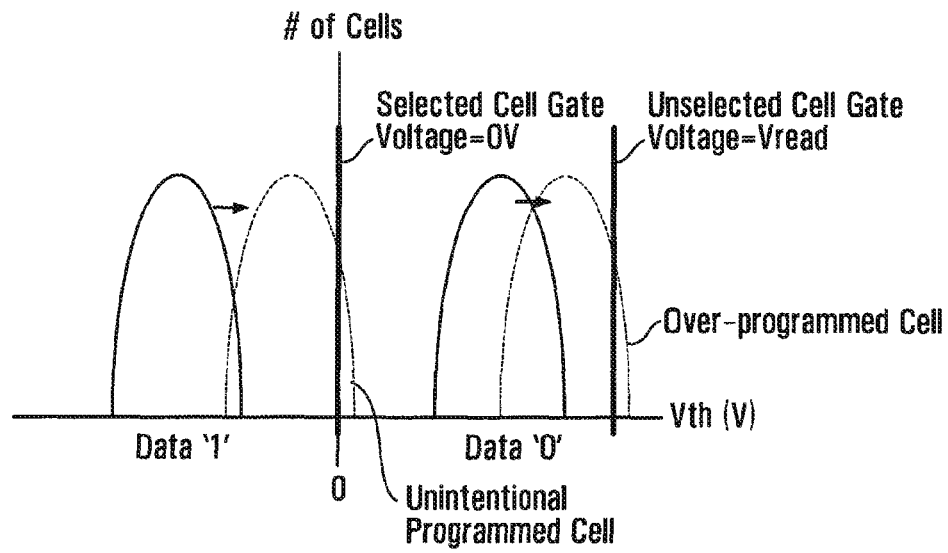
FIG. 18 illustrates a Program Disturbance-Vpgm Disturbance & Vpass Disturbance.

The definition of program disturbance is unintentional program during program operation, which is also described as soft program. For the program/program inhibit schemes described so far, two types of program disturbance exist during program operation as shown in FIG. 18.

Program Voltage (Vpgm) disturbance: a cell of a selected page (set of cells connected to a selected word line i.e. a selected cell) in a program inhibit string experiences program voltage (Vpgm) disturbance due to the voltage difference Vpgm−Vch.

Pass Voltage (Vpass) disturbance: unselected cells connected to unselected word lines in a program string experience pass voltage (Vpass) disturbance due to the voltage difference of Vpass−Vch, whereby Vch~0V.

Figure 17:
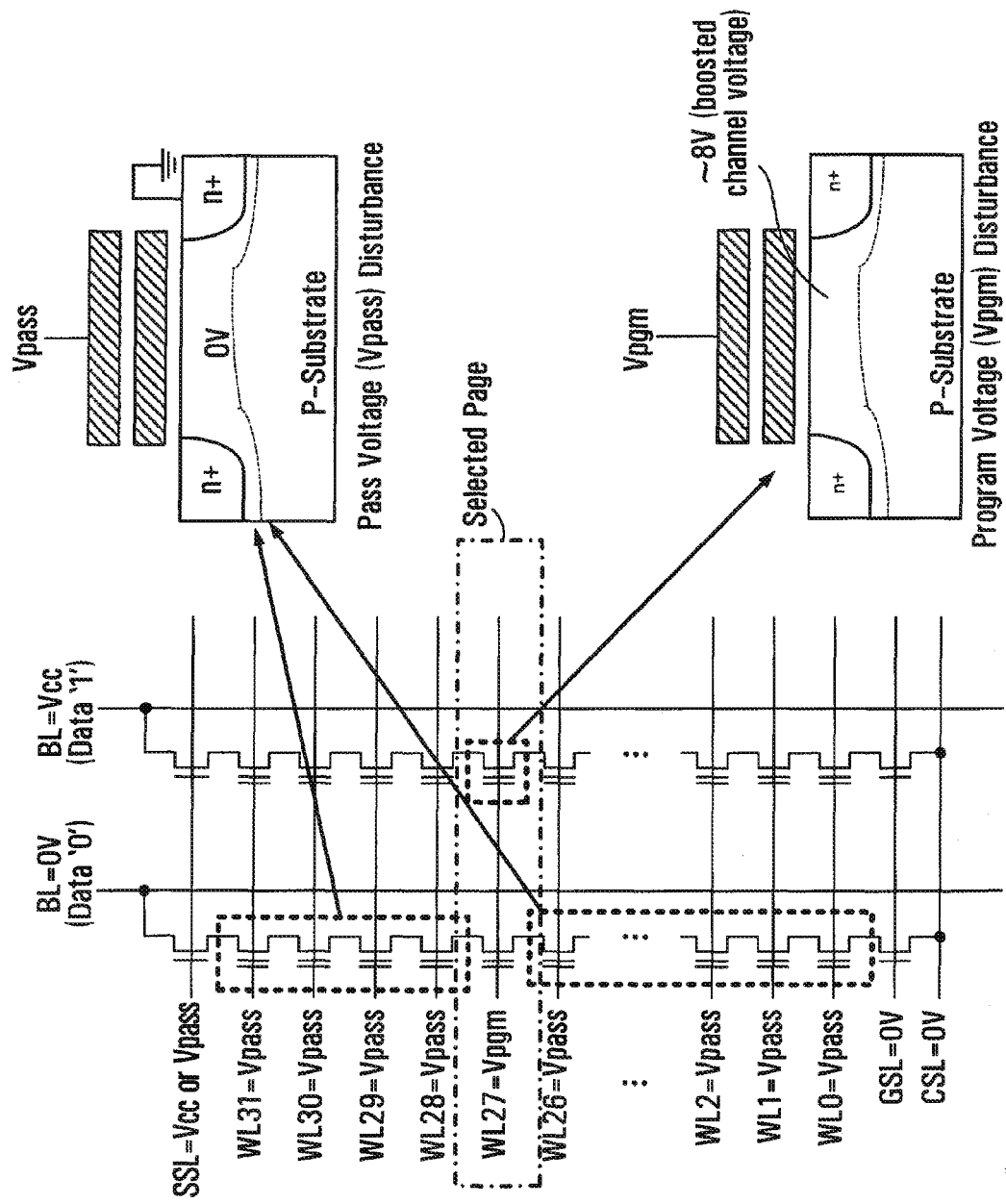
FIG. 17 illustrates major problems due to program disturbance.

By severe program disturbance, two major problems occur as shown in FIG. 17.

Unintentional Program: Erased cells (data '1') are unintentionally programmed (data '0') by the program disturbance.

Overprogram: Vth of programmed cells (data '0') shift to further positive side by the program disturbance. If the Vth of programmed cells shift beyond Vread that is the gate voltage to unselected cells during read, cells are over programmed. When the over programmed cell is unselected, the selected cell cannot be sensed regardless of cell data (Vth) during read because unselected and overprogrammed cells are always turned off even though the gate of overprogrammed cell is biased to Vread.

Figure 19:
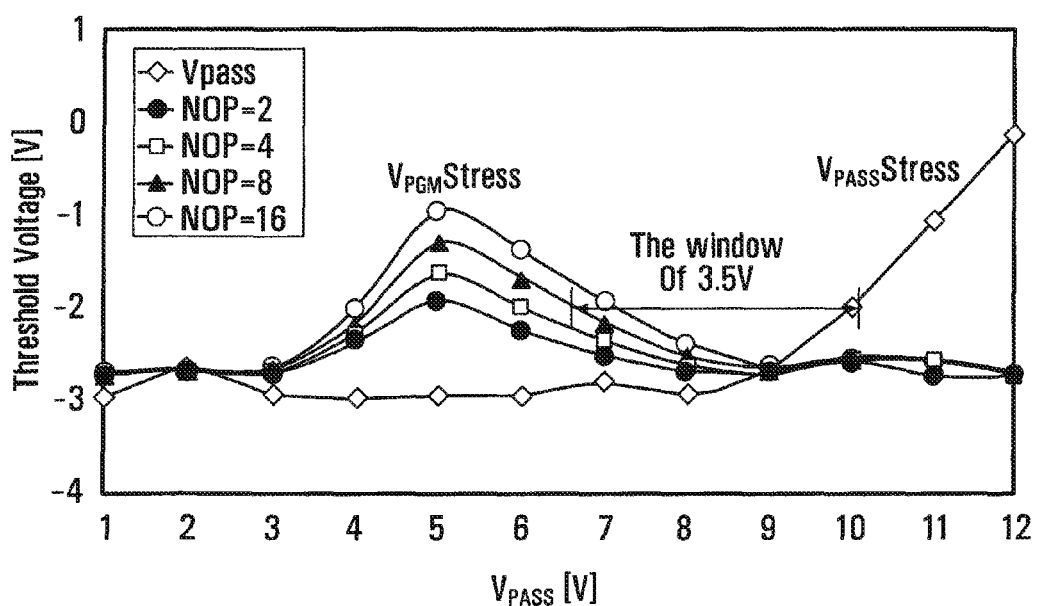
FIG. 19 illustrates a disturbance free-window as a function of Vpass (criteria of Vth=−2 V)

The program disturbance is also a function of stress time (i.e. program time). Typically the program voltage (Vpgm) disturbance and the pass voltage (Vpass) disturbance are characterized by measuring the Vth shift of erased cells with varying Vpass as shown in FIG. 19. It can be seen that Vpgm stress and Vpass stress are in a trade-off situation:

If the voltage level of Vpass is too high, erased cells experience soft program by Vpass disturbance (stress)

If the voltage level of Vpass is too low, erased cells experience soft program by Vpgm disturbance (stress). The cell channel voltage Vch is inherently vulnerable to losing its voltage level through leakage.

From the point of view of attaining a high channel boosting voltage Vch it is advantageous to increase Vpass. However from the point of view of reducing the Vpass disturbance on unselected cells in selected strings it is advantageous to reduce Vpass. Therefore, it would be advantageous to find a safe window of Vpass not to introduce any of the two program disturbances as also shown in FIG. 19Error! Reference source not found. FIG. 19 depicts known example (see, June Lee et al., "High-Performance 1-Gb NAND Flash Memory With 0.12 um Technology," IEEE J Solid-State Circuits, vol. 37, no. 11, pp. 1502-1509, November 2002.

With the channel self-boosting program inhibit scheme the program disturbance becomes harsher with the scaling of the power supply voltage Vcc because the NAND cell string channel is initially precharged to Vcc−Vth of SSL transistor before being self-boosted by Vpgm and Vpass, and thus a higher precharge level is advantageous.

Another problem is that the program disturbance becomes more significant with increasing the number of cells per string because each cell experiences program disturbance (# of cell per NAND string−1) times. E.g. the number of cells to be disturbed in 32-cell NAND structure is twice as large as that of a 16-cell NAND structure. Finally the total number of partial program cycles in a page is restricted by the program disturbance (the selected page can be programmed partially).

Fringe-Field Induced Source/Drain

Many NAND cell transistors contain diffused n-type sources and drains. Although these kinds of cells are among the most widely used, there exist important different types of cell structures, which will be described in the following, as non-limited embodiments of the present disclosure relates to these specific types of cells.

In some common situations there is the need not to use diffused n (or p)-type sources and drains NAND memory devices. These cases may include situations where short channel effects due to device scaling are an issue. Other cases may include memory devices where the channels and the sources/drains of the cell transistors are aligned vertically to the chip surface and where implanting of impurities into the cell substrate poses a problem.

For these cases sources and drains may be formed not by diffused layers which permanently exist regardless of external bias conditions, but by an inversion layer induced by the electric field between an adjacent cell transistor control gate and the cell substrate. In this case the sources/drains of the cell transistor do or do not exist depending on the external bias applied to the control gates. These kinds of sources and drains will be referred to as "Fringe-field induced" or "virtual" or "inversion layers" sources and drains and cells with this kind of structure will be referred to as "junctionless" [e.g.,

- Ki-Tae Park et al., "A Novel nand Flash Memory With Asymmetric S/D Structure Using Fringe-Field-Induced Inversion Layer", Electron Devices, IEEE Transactions on, Volume: 55, Issue: 1, Page(s): 404-410;
- Hang Ting Lue et al., "A novel junction-free BE-SONOS NAND flash" VLSI Technology, 2008 Symposium on, Page(s): 140-141;
- Chang-Hyun Lee, "Highly scalable NAND flash memory with robust immunity to program disturbance using symmetric inversion-type source and drain structure", VLSI Technology, 2008 Symposium on, Page(s): 118-119;
- U.S. Pat. No. 8,259,503 B2, Semiconductor device having a field effect source/drain region;
- Hang-Ting Lue et al., "A Highly Scalable 8-Layer 3D Vertical-Gate (VG) TFT NAND Flash Using Junction-Free Buried Channel BE-SONOS Device", VLSI Technology (VLSIT), 2010 Symposium on, Page(s): 131-132;
- Kuo-Pin Chang et al., "Memory Architecture of 3D Vertical Gate (3DVG) NAND Flash Using Plural Island-Gate SSL Decoding Method and Study of it's Program Inhibit Characteristics", Memory Workshop (IMW), 2012 4th IEEE International, Page(s): 1-4;
- Dongyean Oh et al., "A New Self-Boosting Phenomenon by Source/Drain Depletion Cut-off in NAND Flash Memory", Non-Volatile Semiconductor Memory Workshop, 2007 22nd IEEE, Page(s): 39-41.

Figure 20:
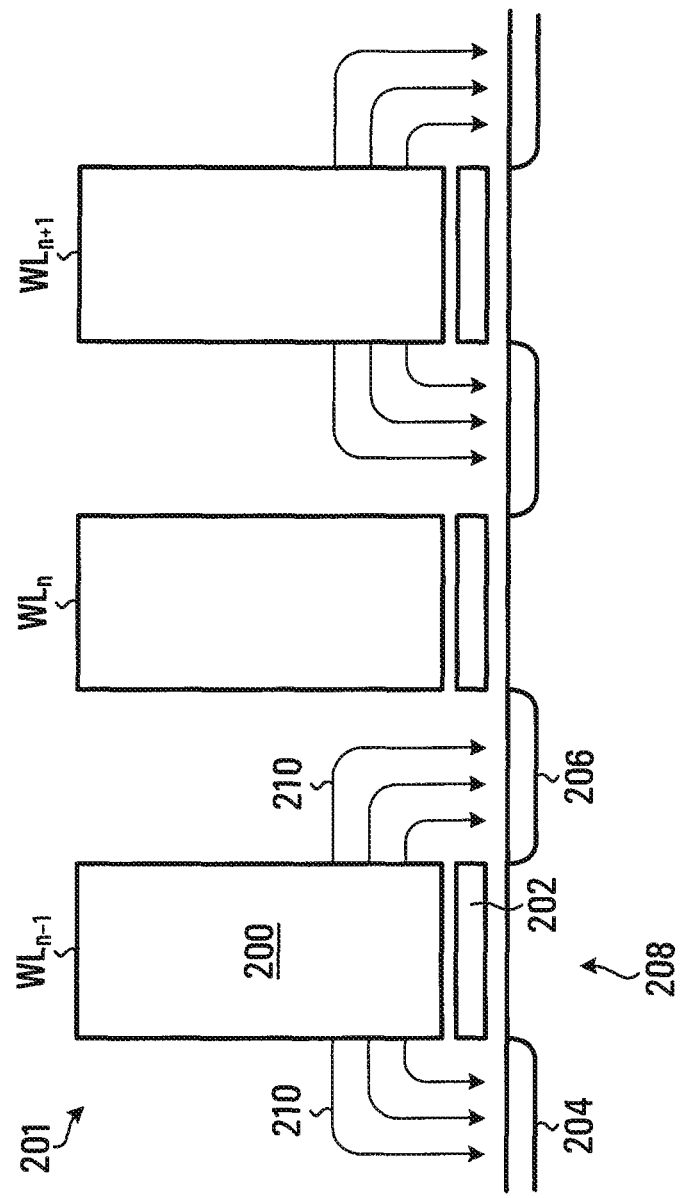
FIG. 20 illustrates a Fringe-field induced source/drain.

FIG. 20 depicts an example of a Fringe-field induced source/drain (see, for example, U.S. Pat. No. 8,259,503 B2). FIG. 20 depicts the structure of a NAND cells containing junctionless transistors. The semiconductor device does not include PN-junction source/drain regions formed of diffusion layers that are different from a substrate in conductivity. Rather, voltages applied to gate electrodes $WL_{n-1}$-$WL_{n+1}$ induce fringe fields between the gate electrodes and the substrate. These fringe fields induce inversion layers generated in the substrate which function as source/drain regions. Specifically, for cell 201, shown is a gate electrode 200 and charge storage layer 202. When an appropriate voltage is applied to the gate electrode 200, fringe field 210 forms, and causes the formation of source and drain regions 204,206 within substrate 208. See for example, U.S. Pat. No. 8,259,503, hereby incorporated by reference in its entirety, for an example description of junctionless semiconductor device.

Fringe-field induced inversion layers as sources/drains in cell transistors only exist when a positive bias (in the case of NMOS devices) is applied to the adjacent control gate electrode, e.g. a program voltage Vpgm or a pass voltage Vpass during program operation, or pass voltage Vread during read operation. Otherwise, if no external bias is applied to the control gates the source/drain regions of the cell transistors will be in a depletion state with no free electrons (or holes) to serve as carriers, as the charge trapped in the floating gate (or charge trapping layer) will not generate a fringe field strong enough to induce inversion layers in the source/drain region. This is especially so since from a geometrical point of view the trapped charges will be located mainly in a thin layer directly facing the tunnel oxide layer. Generally, since the fringe field between the control gate and the substrate is not as strong as the field under the gate oxide, a higher voltage is needed to induce an inversion layer in the source/drain region than is needed to induce an inversion layer in the channel region of a cell transistor.

EXAMPLES AND EMBODIMENTS

One aspect of the present disclosure may provide a solution for program inhibit of cells in program inhibited strings as defined in the previous sections during program operation.

Another aspect of the present disclosure may provide a solution for avoiding program disturbance of already programmed cells especially in program strings during program operation, caused by the influence of pass voltages Vpass applied for the purpose of channel self-boosting in program inhibited strings. Assuming that all cells in a string with, for example, 8 cells have been programmed, each cell will have experienced Vpass disturbance during 7 program operations. Cells that have already been programmed are especially vulnerable to any subsequent disturbance as data is already written to them and any shift in the cell level cannot be detected and corrected any more at a later programming operation. On the other hand, cells that have not yet been programmed are less vulnerable, since they do not bare any data yet. Even if inadvertent (soft) programming from data '1' to data '0' occurs in a cell yet to be programmed, this may be detected during later program/verify operation and corrected by some appropriate method. Therefore it may be desirable to protect cells that have already been programmed with valid data from disturbance imposed by a Vpass voltage during program/program inhibit. Also, it is desirable to protect cells that have already been programmed with valid data in the ascending programming sequence and are located on the source side of a selected word line which is biased with a program voltage Vpgm.

Embodiments

Embodiments use suppression of the formation of an inversion-layer source and drain in at least one of the junctionless transistors to cause a discontinuous channel in at least one string.

In the description that follows, the following terminology is used:

there are multiple wordlines and multiple bitlines;

a selected wordline is the wordline that is biased at a program voltage;

there is at least one string for each bitline, each string is composed of NAND flash memory cells. Each string has a drain side and a source side. Each wordline is connected to a cell of one of the strings for each bitline.

During program operation:

for each bitline, there is a selected cell of one of the strings for the bitline, which is connected to the selected word line;

for each bitline, there is a selected string for the bitline which contains the selected cell for that bitline;

each bitline is either a program bitline in which case the selected string for the bitline is a program string, or a program inhibit bitline in which case the selected string for the bitline is a program inhibit string;

bit line voltage=0V for program bitline; more generally, the bit line voltage for program bit lines is a low voltage, for example 0V, which ensures that the string select transistors of program strings stay turned on during program operation such that the string channels of program strings stay tied to the bit line voltage;

bit line voltage=Vcc for program inhibit bitline; more generally; the bit line voltage for program inhibit bit lines is a voltage, for example Vcc, which ensures that the string select transistors of program inhibit strings are turned off at some point during program operation such that the string channels of program inhibit strings are cut off from the bit line voltage and are floating thereafter;

Vpgm is a program voltage applied to a selected wordline;

Vpass is a voltage applied to a non-selected wordline that is high enough to participate in a channel boosting method; and Vsuppress is a voltage applied to a non-selected wordline that is low enough to suppress the formation of fringe field induced source/drains; Vsuppress is lower than Vpass.

Some embodiments includes a mechanism of program and program inhibit, with string channels being tied to 0V for program strings (more generally to a voltage low enough that channel boosting does not occur), and string channels being boosted to inhibit programming for program inhibit strings.

A cut-off (isolation) mechanism is provided for the boosted string channel in program inhibit strings during program operation which utilizes the suppression of electric fringe-fields in the source/drain regions of junctionless cells. This cut-off mechanism enables a freedom in choosing word line biasing conditions which can be chosen to have a protective effect on cells during program operation as will be described in more detail.

Non-limiting embodiments of the present disclosure will be described using specific word line voltages and the program timing in FIG. 16 which is repeated in FIG. 21 for better visibility. Again it is emphasized that the present disclosure is not restricted to any specific biasing voltages or program timing scheme in particular. The present disclosure will also be described by way of example using the illustrations of NAND cell strings in FIG. 22 to FIG. 24B.

Junctionless transistors are used, that for example form part of a NAND Flash memory device. The sources and drains of juntionless NAND cells are not formed by impurity implant (diffusion) and sources and drains and free charge carriers do not permanently exist independently of external biasing conditions. Source/drain regions of cell transistors consist of inversion layers which are induced by the electric fringe field of the neighboring cell gates, and are otherwise non-existent (depleted) if fringe fields strong enough to induce inversion layers in the source/drain regions are not present.

In some embodiments, the spacing of the NAND Flash cell is tuned in a way that fringe-fields are strong enough to induce conducting source/drain regions only if at least one cell adjacent to the source/drain region has a sufficiently high gate bias (e.g. Vread=5 V or higher or Vpass=10V, or Vpgm=18V) applied to its control gate.

In some embodiments the spacing of the NAND Flash cell is tuned in a way that for voltages below a certain level applied to the control gates of adjacent cells, electric fringe fields in the source/drain region between the two adjacent cells are too weak to induce inversion layers between the cells and the formation of sources/drains is thus suppressed. For example, if a Vsuppress voltage of 0V (relative to the substrate bulk) is applied to the control gates of two cell transistors adjacent on both sides of a source/drain region, the electric fringe field will be too weak to induce a conducting inversion layer in the source/drain region, even if there should be negative charge stored in the floating gate (or charge trapping layer) and the cell transistors are in a turned-on state with a conducting cell channel region under the tunnel dielectric. Whenever this is the case this has the effect of cutting the string channels into isolated pieces in between cells even though both cell transistors may be in a turned-on state with a negative threshold voltage and have conducting cell channel regions below the gate tunnel oxide.

Programming in a program string is achieved by a voltage difference between the positive Vpgm voltage applied to the control gate of a selected cell transistor and the ground level channel voltage Vch of the selected string. As previously described and is the case in some common existing schemes the ground level of the string channel in a selected string is achieved by maintaining an electrical connection between a program bit line at 0V and the string channel in the program string through the string select transistor which is open during programming operation.

Inadvertent programming of a cell transistor connected to a selected word line (biased at Vpgm) in a program inhibit string during program operation is inhibited by the channel-boosting program inhibit scheme where the channel inversion region under the tunnel dielectric of the cell connected to the selected word line is floating and is boosted through capacitive coupling to the control gate of one or more cell transistors.

In program inhibit strings during program operation there may exist a continuous conducting channel on the drain side of the selected word line extending from the drain of the string to the cell transistor connected to the selected word line.

In a program inhibit string during program operation there is no continuous conducting string channel region extending through the entire string from the drain to the source of the string except in some cases where the selected wordline is the wordline which is closest to the source of the string. Instead the conducting channel region in a program inhibit string is broken into multiple pieces of conducting regions that exist due to non-formation of fringe field induced source/drain regions which are electrically isolated from each other by non-conducting regions that exist due to non-formation of fringe-field induced source/drain regions thereby forming a discontinuous string channel. Alternatively, the string channel may be made discontinuous in the sense that it is cut off at a certain point, typically on the source side of the selected wordline. Another section of string channel may or may not exist further towards the source side of where the cut off exists.

In program inhibit strings during program operation there is no continuous conducting channel region extending through the entire region from the cell transistor connected to the selected word line to the source of the string. Instead the conducting channel region on the source side of the selected word line (if it exists) is isolated from another conducting channel region which includes the channel region under the tunnel dielectric of the cell transistor connected to the selected word line and thus the two conducting channel regions are electrically isolated from each other.

In program inhibit strings during program operation there are isolating regions where the continuity of conducting string channels is broken. The isolating regions exist in the source/drain regions between cell transistors.

In program inhibit strings during program operation the electric isolation at source/drain regions which isolate multiple conducting channel regions from each other are formed in a way that electrically conducting sources/drains are suppressed because the electric fringe fields in these regions are too weak to support an inversion layer between two adjacent cell transistors.

Contrary to some existing schemes the conducting channel in a program inhibit string during program operation is not broken into isolated parts by suppressing a conductive channel underneath the tunnel dielectric by means of turning off cell transistors. Thus it is not the channel regions underneath the tunnel dielectric of cell transistors that act as isolating regions.

Thus the conducting channel regions in program inhibit strings during program operation can be broken into multiple pieces electrically isolated from each other regardless of the programming state of the cell transistors.

Thus if program inhibit in non-selected strings during program operation is performed by channel boosting, the boosted channel region only extends as far as to cell transistors which have a sufficiently high voltage applied to the control gate and can be cut off at source/drain regions regardless of the cell data written to the cells.

An embodiment of the present disclosure will now be further described by way of example.

Figure 21:
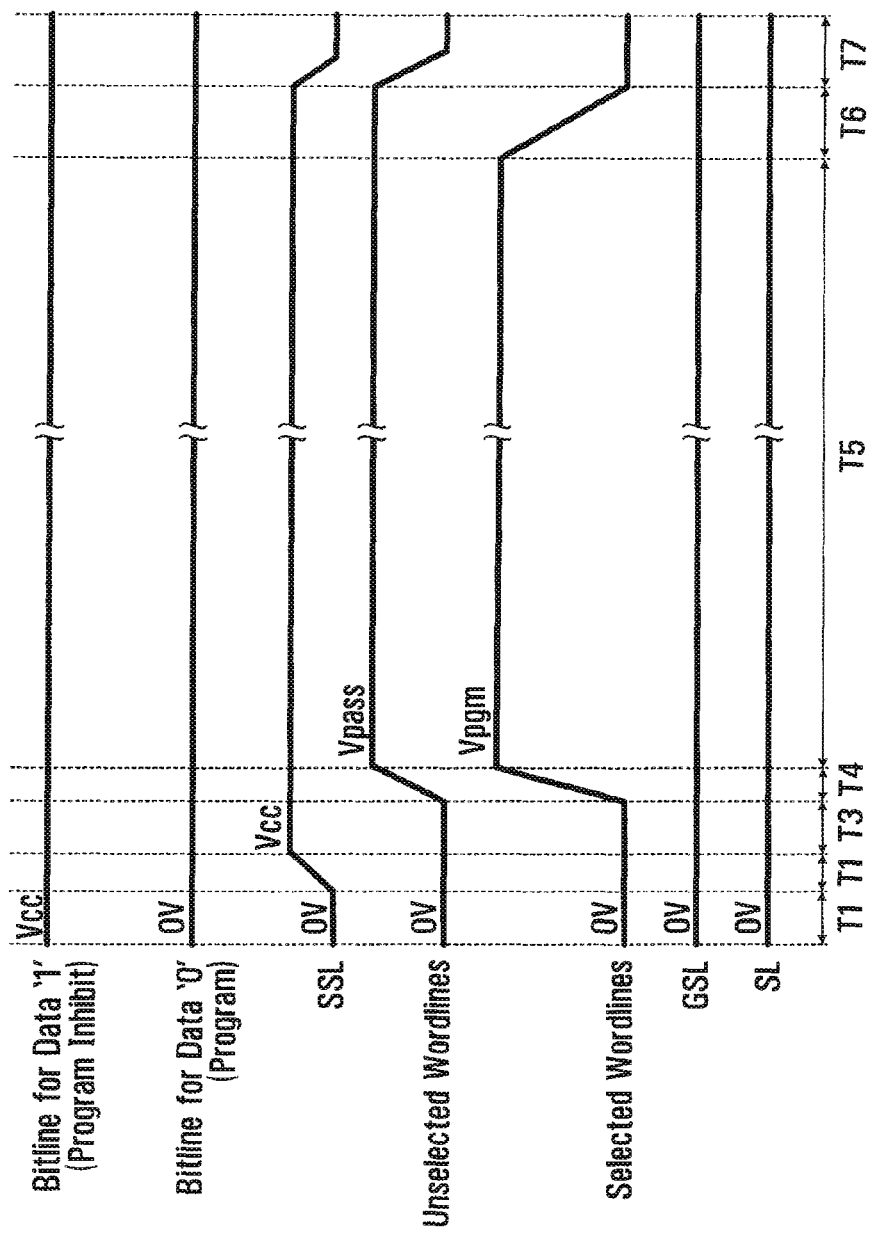
FIG. 21 illustrates program timing used for description of examples of the present disclosure.
Figure 22:
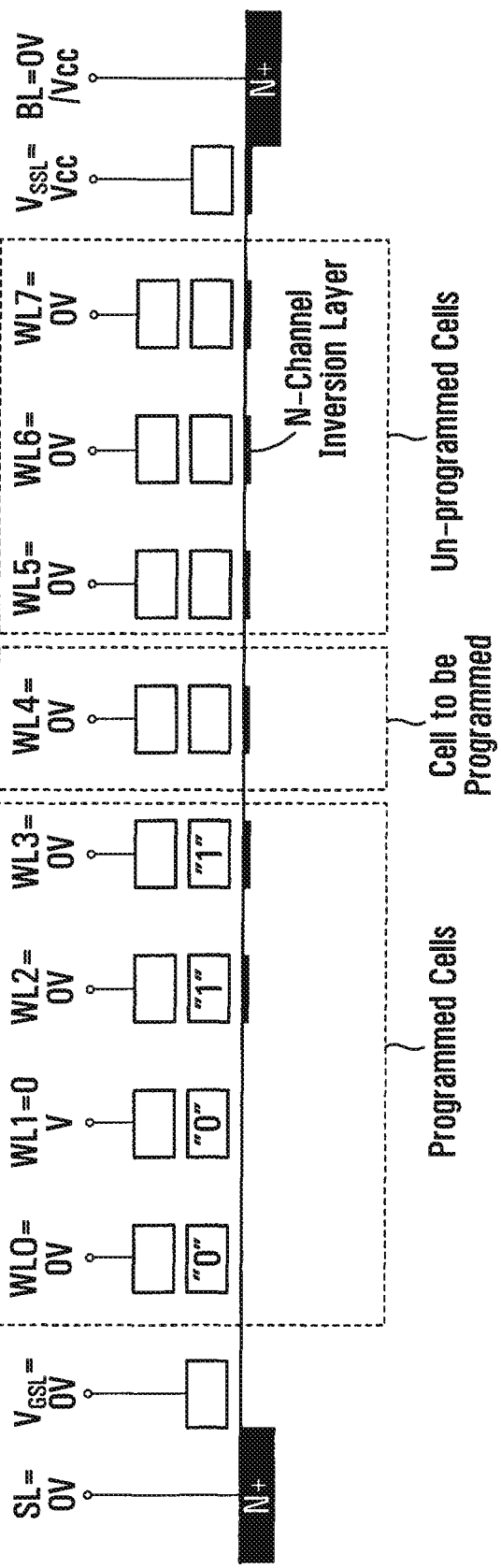
FIG. 22 illustrates a Program (BL=0V)/Program Inhibit (BL=Vcc) string at time T3 before program bias voltages are applied to word lines.

FIG. 22 shows a cell string to be programmed or to be program inhibited (depending on the bit line voltage, 0V or Vcc) of a junctionless NAND cell string before program operation starts. An ascending programmed sequence with pages written from the source to the drain side of strings, is assumed. Therefore FIG. 22 shows some example data already written to the cells on the source side of the selected word line, but no data written yet to the cells on the drain side. The string is shown at time T3 from FIG. 21 before any Vpgm or Vpass voltages are applied to the word lines, however with the bit line and the string select line already biased at 0V or Vcc, depending whether the string is a program string or a program inhibit string. All word line voltages are therefore still at 0V. Channel and source/drain inversion regions with free charge carriers are drawn as bold black lines or rectangles in this figure as well as all subsequent figures showing cell strings. The bold black lines under the cell gates with data "1" (erased) or under the cells not yet programmed suggest that a cell channel consisting of an inversion layer exists under these cell gates, as the threshold voltage of erased cells is negative.

Figure 23:
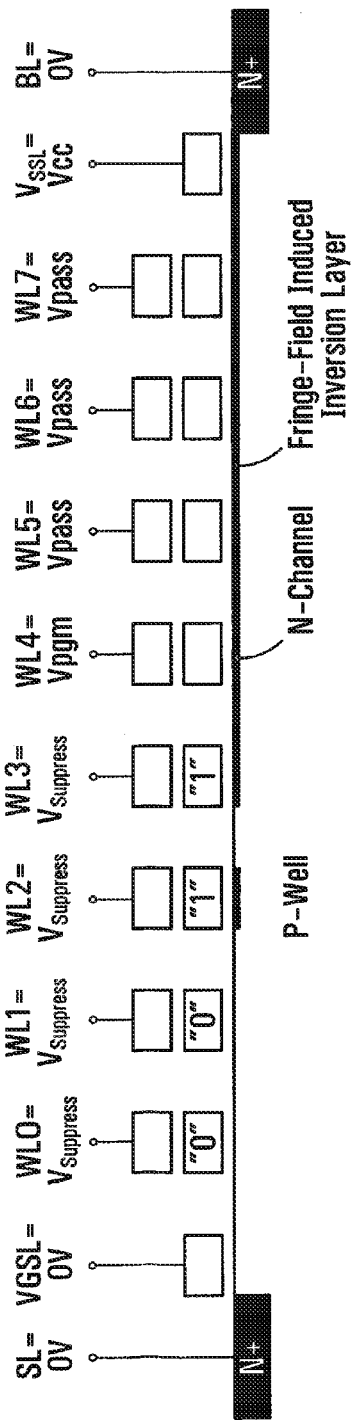
FIG. 23 illustrates a Program string (BL=0V) at time T5 with full program bias voltages applied to word lines, source/drain inversion layers induced by the gate fringe fields and Vch=0 V.

Next, in FIG. 23 a program string (with BL=0V) is shown at time T5 with full Vpgm applied to the cell connected to WL4 and Vpass applied to the word lines on the drain side. As one of the specific features of this embodiment, Vsuppress=0V instead of Vpass is applied to all of the word lines on the source side. Recall that a Vsuppress voltage is a voltage applied to a non-selected wordline that is low enough to suppress the formation of fringe field induced source/drains and that Vsuppress is lower than Vpass. More generally, a Vsuppress voltage is applied to at least one word line on the source side. In some embodiments, a Vsuppress voltage is applied to at least two word lines on the source side. This creates an asymmetric biasing condition, together with the fringe-field induced (or suppressed) source/drain structure. The fact that no Vpass voltage is applied to the word lines on the source side of the selected word line ensures that programmed cells do not experience any Vpass disturbance, which is one of the goals of the present disclosure in some embodiments.

A continuous string channel is formed from the bit line to the cell connected to WL4 (selected word line/cell). However, since word lines on the source side of the selected word line (WL0~WL3 in the example) are kept at the ground level, no continuous string channel is formed on the source side. In the case where the first cell on the source side adjacent to WL4 is in an erased state (data "1") the string channel may extend at most to this cell. The string channel on of each program bit line the drain side is tied to the bit line level 0V and programming occurs of the selected cell through the voltage difference between Vpgm and the cell channel voltage Vch of the selected cell when equals the bit line level due to the continuous channel.

Figure 24A:
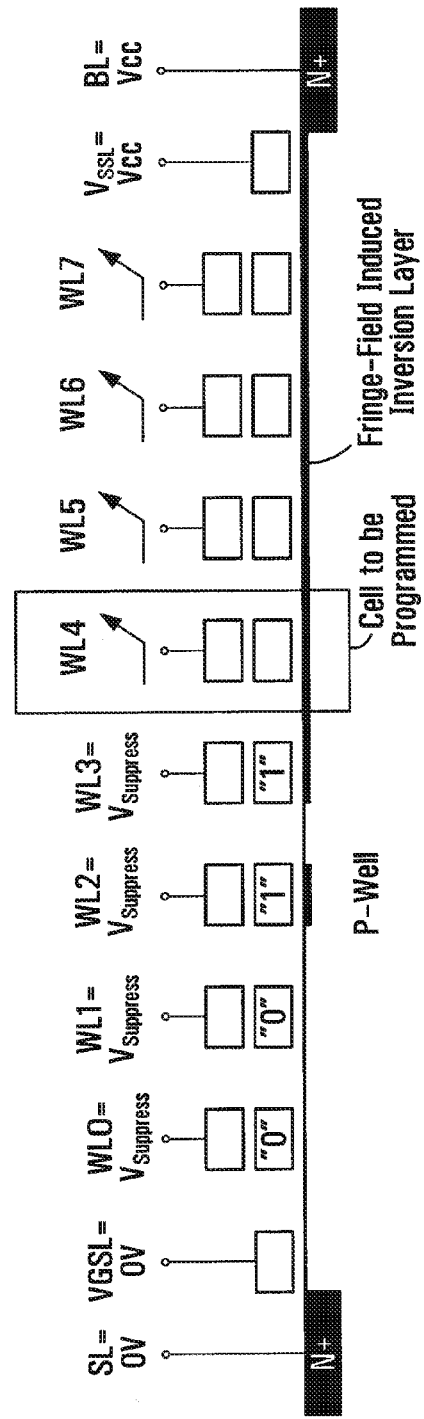
FIG. 24A illustrates a Program inhibit string (BL=Vcc) at the beginning of time T4 during channel-bitline charge sharing with rising word line voltages, source/drain inversion layers induced by the gate fringe fields and string channel voltage starts rising towards Vch=Vcc−Vth(SSL)
Figure 24B:
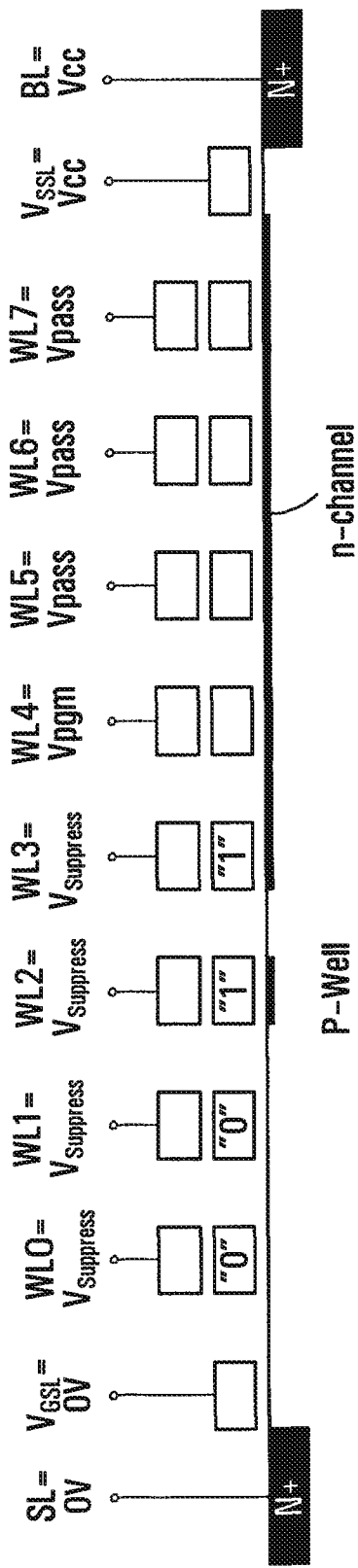
FIG. 24B illustrates the Program inhibit string of FIG. 24A at a later time after the string channel has been cut off.

Next, a program inhibited string during program operation is described using FIG. 24A. When the control gates of the cell transistors on the drain side of the selected word line are raised through the application of Vpass wordline voltages, a continuous channel is formed which is precharged by the bit line. This is shown in FIG. 24. A by the continuous bold black line stretching under the cells connected from WL3 to WL7. The channel can be precharged up to a level of Vcc-Vth(SSL) after which it is isolated from the bit line node because the SSL transistor turns off as depicted in FIG. 24B.

As mentioned before, the word lines on the source side of the selected word line (WL4 in the example) are kept at the ground level. In cell structures without fringe-field induced sources/drains this kind of word line biasing would not ensure reliably that the string channel is cut-off at the word lines with Vsuppress bias. The reason is that source side cells may be in an erased state (data '1') in which case the cells have negative Vth and a turn-off of the cells cannot be guaranteed, even with a control gate voltage of Vsuppress. In the worst possible case all source side cells are in an erased state. In cell structures without fringe-field induced sources/drains this would possibly result in a continuous string channel from the drain to the source of the cell string. Since the channel-boosting level Vch relies critically on the Vpass voltages in conventional global channel-boosting schemes, such a scenario would be very vulnerable to lowering the Vch level and thus to Vpgm disturbance.

However, in embodiments of the present disclosure the channel is cut-off between two cells to which a control gate bias of Vsuppress is applied, because no fringe-field induced source/drain can form under this condition. Even in the worst case of all source side cells being in an erased state this cut-off location would be between the two cells adjacent to WL4 (program cell) on the source side. No continuous string channel on the source side which could act as a leakage path forms under any conditions. In the event there is any one cell on the source side of the selected word line, application of Vsuppress to the word line connected to the single cell will still result in a discontinuous channel in the string that the channel does not run all the way to the ground select transistor.

Even in the case where source-side cells adjacent to the selected word line are programmed with 'data 1' (Vth<0), or the worst case where all cells in the string are programmed with 'data 1', the precharging voltage from the bit line is passed only up to the first cell which is programmed to 1. Even in this case, no unbroken continuous chain of channels and source/drains is formed by the control gates of the source side cells as no fringe field exists that would be strong enough to induce source/drain inversion layers.

The channel isolation method utilizing the suppression of the inversion layer in the source/drain region as proposed in the present disclosure may be superior to prior schemes for which the isolation method depends on suppressing the channel inversion layer underneath the tunnel dielectric of the cell transistors (such as the local channel boosting scheme). In some embodiments of the present disclosure, the effectiveness of string channel isolation between the drain side and the source side of the string is not dependent on the data written to the cell transistor at which the cut-off occurs. In previous schemes (local channel boosting), depending on the written data a cell transistor may not completely turn-off even with 0V gate bias applied in which case an effective isolation may not occur.

Some embodiments of the present disclosure may also be advantageous because they give higher freedom to choose the word line bias voltage for cell transistors which are isolated from the boosted channel. In prior schemes Vpass voltages can generally not be chosen to be too low even for a subset out of the entirety of word lines of a string. The reason is that the string channel boosting level in program inhibit strings depends critically on the applied Vpass voltages which actively participate in boosting the channel level. In the present disclosure, word line voltages on source side cells can be chosen to be so low as to suppress the formation of sources/drains entirely. In this case the boosted channel is isolated from the source side region in which a continuous string channel does not form. Thus, the boosted channel is shortened to the same extent to which low Vpass voltages are applied to source side cell transistors, which means that the coupling capacitance of the channel to the bulk is reduced. This means that applying Vsuppress voltages (such as 0V) to word lines on the source side of the string does not diminish the channel boosting efficiency, so word line voltages can be chosen to be low enough to reduce Vpass disturbance.

In contrast, in existing approaches, the Vpass voltages are applied on the source side word lines that need to be high to assist in channel boosting.

With the system and method described herein, the source side Vsuppress word line voltages do not participate in channel boosting anymore and can therefore be chosen to be low.

Variations (1) Word Line Bias Conditions

Although embodiments of the present disclosure are described with specific word line biasing conditions, they are not restricted to any specific biasing conditions as long as fringe-field induced channel cut-off at source/drain regions is utilized to isolate the boosted channel region from the source side region.

Source-Side Vsuppress Voltages

Although embodiments of the present disclosure have been described with all source-side word lines being biased to Vsuppress=0V during program operation to suppress any inversion layer from forming in the source/drain regions, the word line voltage does not necessarily have to be 0V. Any word line voltages low enough to suppress fringe-field induced inversion layers in the source/drain regions are also possible.

Although embodiments of the present disclosure have been described with source-side word lines being biased in a way that fringe-fields are suppressed at all source-side cell transistors, it is also possible to suppress the fringe-field at only one source/drain region to isolate the drain-side channel at one point. Once the drain-side boosted channel is cut off and electrically isolated from the source side at one point, it is not necessary to break the source side region at additional points.

Graded Change in Cut-Off Voltage

Although embodiments of the present disclosure have been described with an abrupt change in voltage with the selected word line being biased with the program voltage Vpgm and the adjacent source-side word line being biased at Vsuppress=0V, the change in voltage may also be designed to be graded. In some embodiments, the word line adjacent on the source side to the selected word line may be biased with an intermediate voltage which is lower than Vpgm but higher than 0V and higher than the voltage of the word line one step further to the source side.

(2) Directional Geometry and Substrate Type

Although embodiments of the present disclosure have been illustrated showing NAND cell strings aligned in the horizontal direction, without any explicit specification about the type of the transistors and the substrate, some embodiments of the present disclosure are not restricted to any directional cell geometry, type of the transistors or the substrate. In particular, some embodiments of the present disclosure equally apply to NAND Flash devices where cell strings are stacked in the vertical direction. Some embodiments of the present disclosure equally apply to NAND Flash devices where the channels of the cell transistors are aligned in a vertical direction to the chip surface. Some embodiments of the present disclosure equally apply to NAND Flash devices where the channels of the cell strings are aligned in a vertical direction to the chip surface. Some embodiments of the present disclosure equally apply to NAND Flash devices where the cell strings are formed as pillars which are aligned in a vertical direction to the chip surface. The present disclosure equally applies to NAND Flash devices where the cell strings are formed as pillars which are aligned in a vertical direction to the chip surface and the gates of cell transistors, string select transistors and ground select transistors are of a gate-all-around type or a double gate type.

Although embodiments of the present disclosure have been described with n-type channels forming on a p-type substrate, the substrate type may be undoped silicon or even inverted with p-channels forming on an n-type substrate. In the latter case the sign of the bias voltages is inverted accordingly.

Some embodiments of the present disclosure equally apply to NAND Flash devices where the substrate of the cell transistors is formed on a non-conducting layer (commonly referred to as silicon-on-insulator or SOI). Some embodiments of the present disclosure equally apply to NAND Flash devices where the substrate of the cell transistors is formed on a non-conducting layer (commonly referred to as silicon-on-insulator or SOI) and the cell body becomes fully depleted during cell operation (commonly referred to as FDSOI). Some embodiments of the present disclosure equally apply to NAND Flash devices where the non-conducting layer in an SOI structure is formed in the inside of pillars which constitute the cell strings.

(3) Multi-Level Cells

Although embodiments of the present disclosure have been described using the example of 1-bit per cell, this present disclosure equally applies to MLC (multi-level cell) NAND devices. The need to protect programmed cells from program disturbance is even greater for MLC NAND as the spacings between adjacent Vth levels in the cell transistors is usually smaller than for SLC, and MLC cells are therefore more vulnerable.

(4) Program Timing

Although the embodiments of the present disclosure is described using the program timing in FIG. 21, they are not restricted to any specific program timing. They apply equally to various program timing schemes, for example:

Word lines including the selected word line may be raised to a pass voltage Vpass first. After a delay time the selected word line may be further raised to the full program voltage Vpgm.

Program and/or pass voltages may be applied in a pulsed patterned rather than continuously, for example as described in, e.g., Kang-Deog Suh et al., "A 3.3 V 32 Mb NAND Flash Memory with Incremental Step Pulse Programming Scheme," IEEE J Solid-State Circuits, vol. 30, no. 11, pp. 1149-1156, April 1995.

Figure 25:
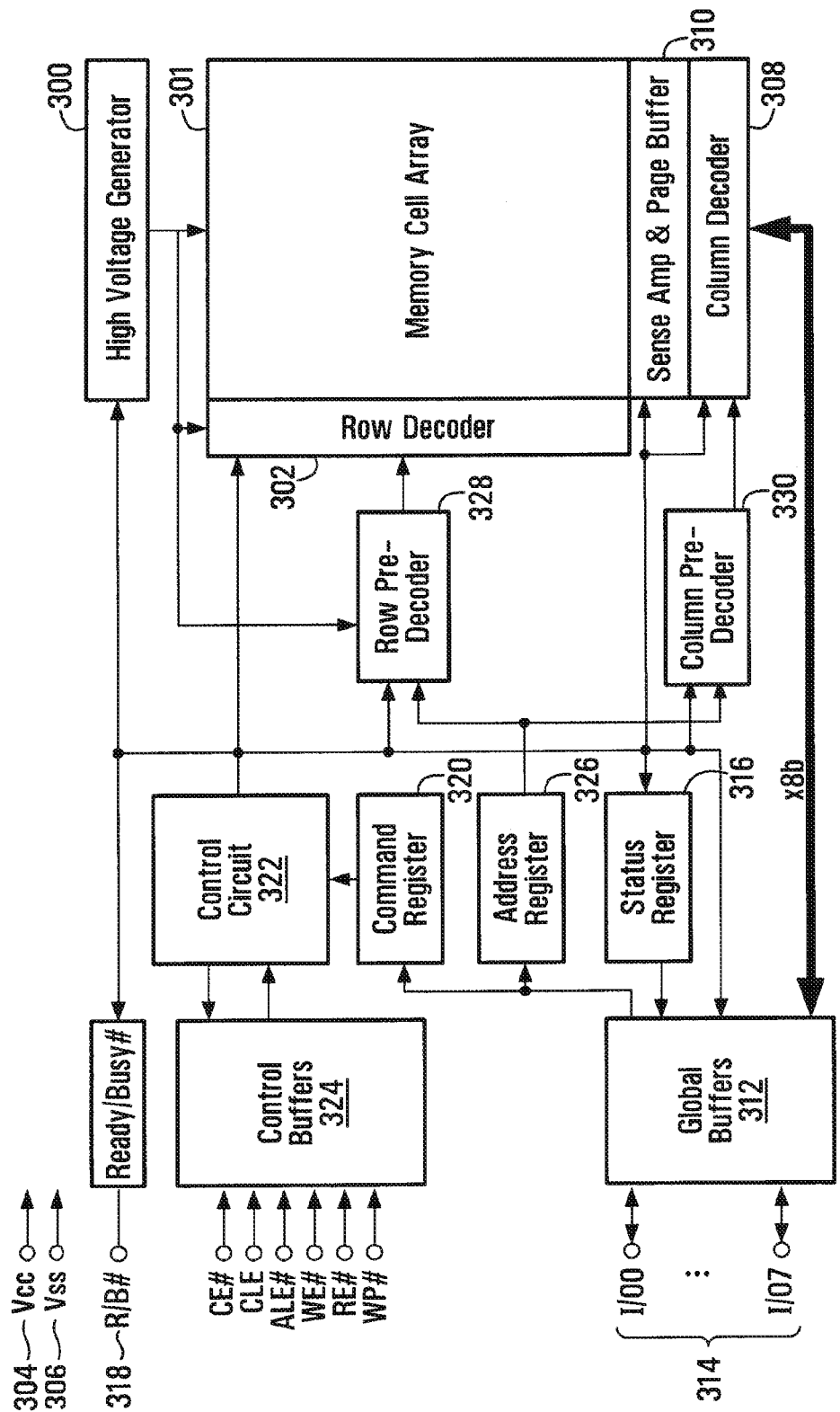
FIG. 25 is a block diagram of a NAND flash memory system.

FIG. 25 illustrates a NAND flash functional block that can, for example, be used for the junctionless NAND flash circuits and methods described herein. The depicted NAND flash has common input and output port (I/O 0 to 7) for transferring address, command and input/output data to and from the device.

Command Latch Enable (CLE): the CLE input signal is used to control loading of the operation mode command into the internal command register. The command is latched into the command register from the I/O port on the rising edge of the WE# signal while CLE is High.

Address Latch Enable (ALE): the ALE signal is used to control loading address information into the internal address register. Address information is latched into the address register from the I/O port on the rising edge of the WE# signal while ALE is High.

Chip Enable (CE#): the device goes into a low-power Standby mode when CE# goes High during the device is in Ready state. The CE# signal is ignored when device is in Busy state (R/B#=L), such as during a Program or Erase or Read operation, and will not enter Standby mode even if the CE# input goes High.

Write Enable (WE#): the WE# signal is used to control the acquisition of data from the I/O port.

Read Enable (RE#): the RE signal controls serial data output. Data is available after the falling edge of RE#. The internal column address counter is also incremented (Address=Address+I) on this falling edge.

I/O Port (I/O0 to 7): I/O0 to 7 pins are used as a port for transferring address, command and input/output data to and from the device.

Write Protect (WP#): the WP# signal is used to protect the device from accidental programming or erasing. The internal voltage regulator (high voltage generator) is reset when WP# is Low. This signal is usually used for protecting the data during the power-on/off sequence when input signals are invalid.

Ready/Busy (R/B#): the R/B# is open drain pin and the output signal is used to indicate the operating condition of the device. The R/B# signal is in Busy state (R/B#=L) during the Program, Erase and Read operations and will return to Ready state (R/B#=H) after completion of the operation.

Note: # denotes active low (i.e. enable when the signal input is Low.

In FIG. 25, the memory core of NAND flash consists of NAND cell having cells 301 formed of junctionless transistors, row decoder 302, sense amp & page buffer 310 and column decoder 308. A page for either read or program operation is selected by the row decoder 302. A block for erase operation is also selected by the row decoder 302. During read operation, the data of the selected page is sensed and latched into sense amp and page buffer 310. After then the data stored in the page buffer are sequentially read out through column decoder 308 and global buffers 312. During programming, the input data from global buffers 312 are sequentially loaded into the page buffer 310 via column decoder 308. The input data latched in the page buffer 310 are finally programmed into the selected page.

High voltage generator 300 provides necessary high voltages and reference voltages during read, program and erase operations.

Global buffers 312 temporarily hold and buffer input and output data via common I/O pins (I/O 0 to 7). The common I/O pins 314 serve as the port for command, address and input/output data.

Status register 316 tracks the device status during read, program or erase operation.

Read/Busy# (R/B#) 318 is another indication pin for device status and has an open drain transistor.

Command register 320 decodes input command from the global buffer and the decoded command is input to the control circuit 322 having state machine.

Control circuit 322 is a central unit to control entire device during various operating modes.

Control buffer 324 determines one of operating modes such as command input, address input, data input, data output and status output in accordance with combination of control pins as CE#, CLE, ALE, WE#, RE# and WP#.

Multiplexed column address and row address are stored in the address register 326 and transferred into row pre-decoder 328, row decoder 302, and column pre-decoder 330 and column decoder 308.

In FIG. 25, the high voltage generator 300 generates the word line Vpgm, Vsuppress and Vpass voltages during read and program/program inhibit using any of the methods described herein. They are passed to memory cell array 301 through the row decoder 302 to the individual word lines, SSL and GSL. The high voltage generator 300 generates the erase voltage during erase operation (not relevant in the present disclosure). In some embodiments which utilize the channel boosting method for program inhibit, bit line voltages during read and program/program inhibit are just Vcc 304 and Vss (ground) 306.

FIG. 25 is a very specific circuit. More generally, in some embodiments, a NAND flash memory has a wordline circuit configured to generate or control generation or application of wordline voltages, and a bitline circuit configured to generate or control generation or application of bitline voltages.

A broad aspect of the present disclosure provides a method in a non-volatile memory system having junctionless transistors comprising suppressing the formation of an inversion-layer source and drain in at least one of the junctionless transistors to cause a discontinuous channel in a program inhibit string. The method can, for example, be applied in a non-volatile memory system comprising NAND flash memory cells composed of junctionless transistors.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration, the elements, circuits and devices are coupled either directly or indirectly with each other.

The above-described embodiments of the present disclosure are intended to be examples only. Alterations, modifications and variations may be effected to the particular embodiments by those of skill in the art without departing from the scope of the present disclosure, which is defined solely by the claims appended hereto.

What is claimed is:

1. A non-volatile memory system comprising:
   junctionless transistors that uses suppression of the formation of an inversion-layer source and drain in at least one of the junctionless transistors formed in a plurality of strings to cause a discontinuous channel in at least one string;
   NAND flash memory cells composed of junctionless transistors;
   a plurality of wordlines;
   wherein during program operation:
   a selected wordline of the plurality of wordlines is biased at a program voltage;
   a wordline voltage low enough to suppress the formation of source/drains is applied on at least one word line on a source side of the selected wordline such that a channel isolation occurs thereby causing the discontinuous channel in the at least one string of the memory system; and wherein wordline voltages are applied to the wordlines on the source side of the selected wordline that decrease in at least two steps from the program voltage.

2. The memory system of claim 1 further comprising:

a plurality of bitlines;

at least one string for each bitline, each string comprising a plurality of NAND flash memory cells, each string having a drain side and a source side, and wherein each wordline is connected to a cell of one of the at least one string for each bitline;

wherein during program operation:

for each bitline, there is a selected cell of the at least one string for the bitline, which is connected to the selected word line; for each bitline, there is a selected string of the at least one string for the bitline which contains the selected cell for that bitline;

the at least one string in which a discontinuous channel is caused comprises the selected string for each bitline.

3. The memory system of claim 2 wherein:

during a program operation and depending on which data type is to be written by each bitline, each bitline is either a program bitline in which case the selected string for the bitline is a program string, or a program inhibit bitline in which case the selected string for the bitline is a program inhibit string;

during program operation, wordline voltages are applied to wordlines on a drain side of the selected wordline such that in each program string, a continuous channel is formed from the bitline for the program string to at least the selected cell of the program string;

the wordline voltages applied to wordlines on the drain side of the selected wordline are high enough to induce transistor channels and source/drains on the drain side of the selected word line of program strings; wherein a channel boosting method is used for each program inhibit string to float a string channel of each program inhibit string and to boost the channel voltage of floating string channels by capacitive coupling to wordlines;

the channel boosting method including applying a bitline voltage level to each program inhibit bitline to control the floating of the string channels.

4. The memory system of claim 3 wherein:

said channel boosting method comprises applying the wordline voltages to wordlines on the drain side of the selected wordline that are high enough to assist in boosting the string channel of each program inhibit string on the drain side of the selected wordline to a voltage level high enough to prevent program voltage disturbance in each program inhibit string;

wherein wordline voltages applied to wordlines on the source side of the channel isolation are chosen to be lower than the wordline voltages applied to wordlines on the drain side of the selected wordline, so as to not cause Vpass disturbance in each selected string.

5. The memory system of claim 1 wherein said at least one wordline on the source side of the selected wordline comprises at least two wordlines.

6. The memory system of claim 3 wherein:

a bitline voltage is applied to each program bitline that is low enough such that a channel of each program string is not floating and not boosted; and a bitline voltage is applied to each program inhibit bitline that is high enough such that a channel is floating and boosted in each program inhibit string.

7. The memory system of claim 6 wherein:

the bitline voltage is applied to each program bitline is 0V; and the bitline voltage is applied to each program inhibit bitline is Vcc.

8. The memory system of claim 1 further comprising:

a wordline circuit configured to generate or control generation and/or application of wordline voltages;

a bitline circuit configured to generate or to control generation and/or application of bitline voltages.

9. The memory system of claim 8 wherein the control circuits are configured to use an ascending programming sequence such that cells are programmed from the source side of the selected strings towards the drain side of the selected strings such that data programmed in any cell in each selected string in the source side direction of the selected cell is to be protected.

10. The memory system of claim 1 wherein as a result of wordline voltages applied to wordlines on the source side of the selected wordline, a conducting channel region in each program inhibit string is broken into multiple pieces of conducting regions which are electrically isolated from each other by non-conducting regions.

11. The memory system of claim 4 wherein a boosted channel region only extends as far as to cell transistors which have a sufficiently high control gate voltages after which the boosted channel region is cut off.

12. The memory system of claim 1 wherein wordline voltages applied to wordlines on the source side of the selected wordline are such that fringe-fields are suppressed to such a low level so as not to induce inversion layers in the source/drain regions at all source-side cell transistors resulting in multiple discontinuities in the channel.

13. The memory system of claim 1 wherein:

a wordline voltage of 0V is applied to each wordline on the source side of the selected wordline.

14. A method for use in a non-volatile memory system comprising junctionless transistors, the method comprising:

during program operation, suppressing the formation of an inversion-layer source and drain in at least one of the junctionless transistors formed in a plurality of strings to cause a discontinuous channel in at least one string of the memory system;

during program operation, applying a program voltage to a selected wordline of a plurality of wordlines;

during program operation, applying a wordline voltage low enough to suppress the formation of source/drains on a source side of the selected wordline such that a channel isolation occurs thereby causing the discontinuous channel in the at least one string;

wherein wordline voltages are applied to the wordlines on the source side of the selected wordline that decrease in at least two steps from the program voltage; and wherein the memory system comprises NAND flash memory cells composed of junctionless transistors.

15. The method of claim 14 for use in a non-volatile memory system comprising a plurality of bitlines, and at least one string for each bitline, each string comprising a plurality of NAND flash memory cells, each string having a drain side and a source side, and wherein each wordline is connected to a cell of one of the at least one string for each bitline, the method further comprising during program operation:

for each bitline, the selected wordline selecting a selected cell of the at least one string for the bitline, such that there is a selected string of the at least one string for the bitline which contains the selected cell for that bitline;

wherein the at least one string in which a discontinuous channel is caused comprises the selected string for each bitline.

16. The method of claim 15 wherein:

during a program operation and depending on which data type is to be written by each bitline, each bitline is either a program bitline in which case the selected string for the bitline is a program string, or a program inhibit bitline in which case the selected string for the bitline is a program inhibit string;

the method further comprising during program operation:

applying wordline voltages to wordlines on a drain side of the selected wordline such that in each program string, a continuous channel is formed from the bitline for the program string to at least the selected cell of the program string, the wordline voltages to wordlines on the drain side of the selected wordline being high enough to induce transistor channels and source/drains on the drain side of the selected word line of program strings;

using a channel boosting method for each program inhibit string to float a string channel of each program inhibit string and to boost the channel voltage of floating string channels by capacitive coupling to wordlines, the channel boosting method including applying a bitline voltage level to each program inhibit bitline to control the floating of the string channels.

17. The method of claim 16 wherein:

using channel boosting comprises applying the wordline voltages to wordlines on the drain side of the selected wordline that are high enough to assist in boosting the string channel of each program inhibit string on the drain side of the selected wordline to a voltage level high enough to prevent program voltage disturbance in each program inhibit string;

the method further comprising applying wordline voltages to wordlines on the source side of the channel isolation that are lower than the wordline voltages applied to wordlines on the drain side of the selected wordline, so as to not cause Vpass disturbance in each selected string.

18. The method of claim 14 wherein said at least one wordline on the source side of the selected wordline comprises at least two wordlines.

19. The method of claim 16 further comprising:

applying a bitline voltage to each program bitline that is low enough such that a channel of each program string is not floating and not boosted; and applying a bitline voltage to each program inhibit bitline that is high enough such that a channel is floating and boosted in each program inhibit string.

20. The method of claim 19 wherein:

the bitline voltage is applied to each program bitline is 0V; and the bitline voltage is applied to each program inhibit bitline is Vcc.

21. The method of claim 14 further comprising:

using an ascending programming sequence such that cells are programmed from the source side of the selected strings towards the drain side of the selected strings such that data programmed in any cell in each selected string in the source side direction of the selected cell is to be protected.

22. The method of claim 14 wherein as a result of wordline voltages applied to wordlines on the source side of the selected wordline, a conducting channel region in each program inhibit string is broken into multiple pieces of conducting regions which are electrically isolated from each other by non-conducting regions.

23. The method of claim 17 wherein a boosted channel region only extends as far as to cell transistors which have a sufficiently high control gate voltages after which the boosted channel region is cut off.

24. The method of claim 14 wherein wordline voltages applied to wordlines on the source side of the selected wordline are such that fringe-fields are suppressed to such a low level so as not to induce inversion layers in the source/drain regions at all source-side cell transistors resulting in multiple discontinuities in the channel.

25. The method of claim 14 wherein:

a wordline voltage of 0V is applied to each wordline on the source side of the selected wordline.

* * * * *